US010644072B2

(12) United States Patent
Lee et al.

(10) Patent No.: US 10,644,072 B2
(45) Date of Patent: May 5, 2020

(54) IMAGE SENSOR INCLUDING A PLURALITY OF PIXEL REGIONS AND AN ISOLATION REGION INCLUDING DEVICE ISOLATION STRUCTURES

(71) Applicant: Samsung Electronics Co., Ltd., Suwon-si (KR)

(72) Inventors: Gwi-deok Ryan Lee, Suwon-si (KR); Kwang-min Lee, Seoul (KR); Tae-yon Lee, Seoul (KR); Masaru Ishii, Hwaseong-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 4 days.

(21) Appl. No.: 15/783,000

(22) Filed: Oct. 13, 2017

(65) Prior Publication Data

US 2018/0331159 A1    Nov. 15, 2018

(30) Foreign Application Priority Data

May 10, 2017   (KR) .................. 10-2017-0058093

(51) Int. Cl.
*H01L 27/30* (2006.01)
*H01L 51/44* (2006.01)

(52) U.S. Cl.
CPC .......... *H01L 27/307* (2013.01); *H01L 51/442* (2013.01)

(58) Field of Classification Search
CPC ...................... H01L 27/307; H01L 51/442
See application file for complete search history.

(56) References Cited

U.S. PATENT DOCUMENTS

| 8,258,558 | B2 | 9/2012 | Kim |
| 8,368,784 | B2 | 2/2013 | Yamaguchi |
| 8,492,864 | B2 | 7/2013 | Watanabe |
| 8,803,598 | B2 | 8/2014 | Sato |
| 9,263,490 | B2 | 2/2016 | Yanagita et al. |
| 9,349,766 | B2 | 5/2016 | Sugiura |
| 9,373,656 | B2 | 6/2016 | Park |
| 9,385,166 | B2 | 7/2016 | Jung et al. |
| 2012/0009720 | A1* | 1/2012 | Shim ................ H01L 27/14625 438/70 |
| 2014/0001454 | A1 | 1/2014 | Miyanami et al. |

(Continued)

*Primary Examiner* — Thao X Le
*Assistant Examiner* — Xia L Cross
(74) *Attorney, Agent, or Firm* — Muir Patent Law, PLLC

(57) ABSTRACT

Provided is an image sensor including an organic photoelectric layer capable of enhancing color reproduction. An image sensor includes a semiconductor substrate including a plurality of pixel regions spaced apart from each other and an isolation region therebetween. Each of the plurality of pixel regions has a unit pixel. The image sensor also includes a device isolation layer in the isolation region and surrounding the unit pixel, a first transparent electrode layer, an organic photoelectric layer, and a second transparent electrode layer. The image sensor further includes a via plug electrically connected to the first transparent electrode layer, and arranged between the device isolation layers in the isolation region. The via plug passes through the isolation region. The first transparent electrode layer, the organic photoelectric layer and the second transparent electrode layer are sequentially arranged over the semiconductor substrate.

8 Claims, 38 Drawing Sheets

(56) References Cited

U.S. PATENT DOCUMENTS

2015/0372036 A1* 12/2015 Suh .................... H01L 27/1462
                                                    348/273
2016/0204156 A1    7/2016  Togashi
2016/0293873 A1   10/2016  Yamaguchi
2016/0351604 A1   12/2016  Kalnitsky et al.
2018/0166475 A1*   6/2018  Chen ................... H01L 27/1463

* cited by examiner

IMAGE SENSOR INCLUDING A PLURALITY OF PIXEL REGIONS AND AN ISOLATION REGION INCLUDING DEVICE ISOLATION STRUCTURES

CROSS-REFERENCE TO RELATED APPLICATION

This application claims the benefit of priority under 35 U.S.C. § 119 to Korean Patent Application No. 10-2017-0058093, filed on May 10, 2017, in the Korean Intellectual Property Office, the disclosure of which is incorporated herein in its entirety by reference.

BACKGROUND

The present disclosure relates to an image sensor, and more particularly, to an image sensor including an organic photoelectric layer.

An image sensor for converting light waves into an electrical signal is used to generate an image in a camera mounted in an automobile, a security device, and a robot as well as consumer electronics (CE) devices such as a digital camera, a camera for a portable phone, and a portable camcorder.

Image sensors having a smaller size and higher resolution have become more prevalent, and thus, an image sensor including an organic photoelectric layer is adopted to reduce a pixel size.

SUMMARY

The present disclosure provides an image sensor including an organic photoelectric layer capable of enhancing color reproduction.

According to an aspect of the disclosed embodiments, there is provided an image sensor including a semiconductor substrate including a plurality of pixel regions spaced apart from each other and an isolation region therebetween. Each of the plurality of pixel regions has a unit pixel. The image sensor also includes a device isolation layer disposed in the isolation region and surrounding the unit pixel, a first transparent electrode layer, an organic photoelectric layer, a second transparent electrode layer, and a via plug electrically connected to the first transparent electrode layer. The via plug is disposed between the device isolation layers in the isolation region, and passes through the isolation region. The first transparent electrode layer, the organic photoelectric layer, the second transparent electrode layer are sequentially disposed over the semiconductor substrate.

According to another aspect, there is provided an image sensor including a semiconductor substrate including a plurality of pixel regions spaced apart from each other and an isolation region. A device isolation layer is disposed between two adjacent pixel regions among the plurality of pixel regions. Each of the plurality of pixel regions has a unit pixel. The image sensor also includes a first transparent electrode layer disposed over the semiconductor substrate and in each of the plurality of pixel regions to correspond to the unit pixel, a second transparent electrode layer formed as an integral part over the plurality of pixel regions, and an organic photoelectric layer disposed between the first transparent electrode layer and the second transparent electrode layer. The image sensor further includes a via plug disposed between the device isolation layers and electrically connecting the first transparent electrode layer and the unit pixel by passing through the isolation region of the semiconductor substrate.

According to another aspect, there is provided an image sensor including a semiconductor substrate comprising a plurality of pixel regions spaced apart from each other and an isolation region therebetween. Each of the plurality of pixel regions has a unit pixel, and a device isolation layer is arranged in each isolation region. The image sensor also includes a first transparent electrode layer arranged over the semiconductor substrate and in each of the plurality of pixel regions to correspond to the unit pixel, a second transparent electrode layer formed as an integral part over the plurality of pixel regions, and an organic photoelectric layer between the first transparent electrode layer and the second transparent electrode layer. The image sensor further includes a via plug arranged between the device isolation layers and electrically connecting the first transparent electrode layer and the unit pixel by passing through the isolation region of the semiconductor substrate. Between two adjacent unit pixels, a width of the via plug is less than a width of the device isolation layer.

BRIEF DESCRIPTION OF THE DRAWINGS

Embodiments will be more clearly understood from the following detailed description taken in conjunction with the accompanying drawings in which.

DETAILED DESCRIPTION OF THE EMBODIMENTS

Figure 1A:
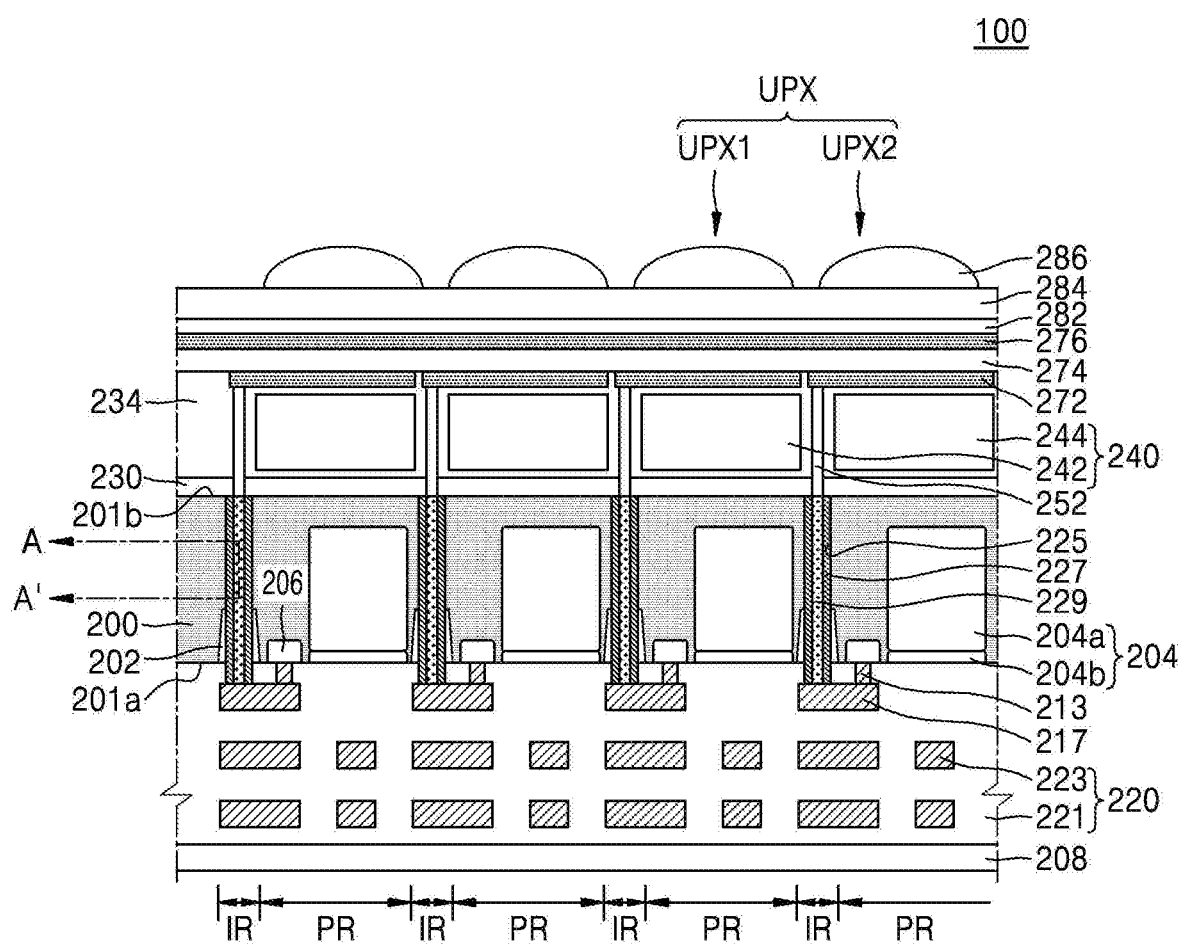
FIGS. 1A and 1B illustrate vertical cross-sectional views of a portion of an image sensor according to an embodiment.
Figure 1B:
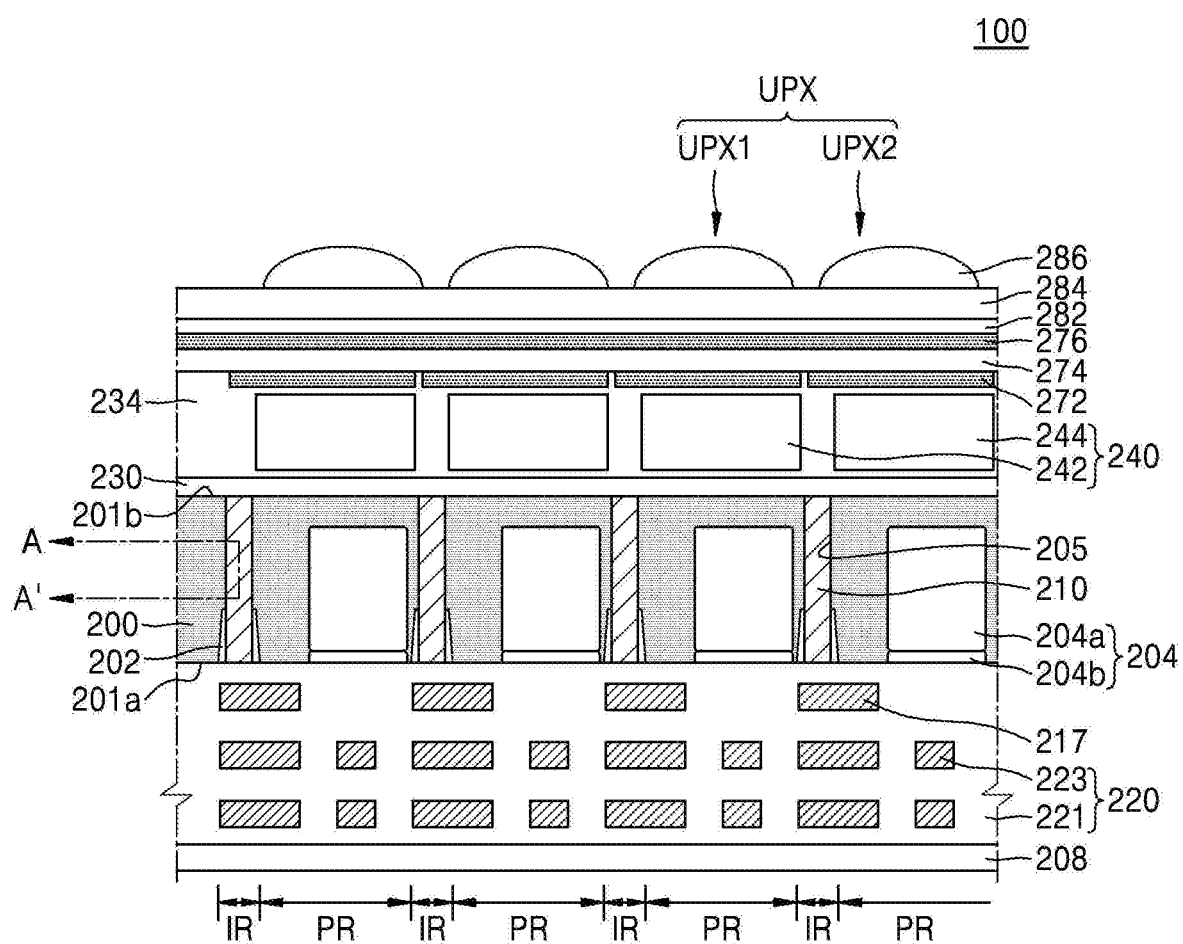

FIGS. 1A and 1B illustrate vertical cross-sectional views showing portions of an image sensor according to an example embodiment.

Referring to FIGS. 1A and 1B, an image sensor 100 includes a semiconductor substrate 200, a plurality of pixel regions PR and an isolation region IR disposed between adjacent pixel regions PR. A unit pixel UPX may be disposed in each of the pixel regions PR. In the semiconductor substrate 200, each of the pixel regions PR may be spaced apart from each other by an isolation region IR.

In the present example, the unit pixel UPX may include at least two photodiodes vertically stacked to detect light of at least two different wavelength bands. In the present specification, it is illustrated, for example, that a unit pixel UPX detects light of two different wavelength bands, but is not limited thereto. In some embodiments, the unit pixel UPX may include a first unit pixel UPX1 capable of detecting red light and green light and a second unit pixel UPX2 capable of detecting blue light and green light. The first and second unit pixels UPX1 and UPX2 may collectively constitute a single color pixel. In some embodiments, the unit pixel UPX may detect blue light, red light, and green light, and, thus, one unit pixel UPX may constitute one color pixel.

The semiconductor substrate 200 may be, for example, any one of a bulk substrate, an epitaxial substrate or a silicon on insulator (SOI) substrate. The semiconductor substrate 200 may include, for example, silicon (Si). Alternatively, the semiconductor substrate 200 may include a semiconductor element such as germanium (Ge) or a compound semiconductor such as silicon carbide (SiC), gallium arsenide (GaAs), indium arsenide (InAs), and indium phosphide (InP). The semiconductor substrate 200 may be configured based on a semiconductor substrate having the first conductive type. The semiconductor substrate 200 may be, for example, a p-type semiconductor substrate.

In the semiconductor substrate 200 of the pixel regions PR, a plurality of photoelectric conversion devices 204 may be disposed. In some embodiments, a photoelectric conversion device 204 may be disposed in each of the pixel regions PR. The photoelectric conversion device 204 may be a photodiode. The photoelectric conversion device 204 may include a first impurity region 204a and a second impurity region 204b. The first impurity region 204a may be deeply formed far from a first surface 201a of the semiconductor substrate 200. The second impurity region 204b may be thinly formed on the first surface 201a of the semiconductor substrate 200. The first impurity region 204a and the second impurity region 204b may have different conductive types from each other. For example, the first impurity region 204a may be doped with n-type impurities, and the second impurity region 204b may be doped with p-type impurities.

In the semiconductor substrate 200 of a plurality of pixel regions PR in which each photoelectric conversion device 204 is disposed, a storage node region 206 may be disposed to be spaced apart from the photoelectric conversion device 204. The storage node region 206, for example, may be doped with n-type impurities. The storage node region 206 may be formed as a single doping region. The storage node region 206 may have a horizontal area smaller than that of the photoelectric conversion device 204.

In the semiconductor substrate 200, device isolation layers 202 and 210 may be disposed in the isolation region IR. The device isolation layers 202 and 210 may include the first device isolation layer 202 and the second device isolation layer 210. The first device isolation layer 202 may extend from the first surface 201a to a second surface 201b, of the semiconductor substrate 200, while having a relatively low height. The second device isolation layer 210 may extend between the first surface 201a and the second surface 201b, of the semiconductor substrate 200, while having a relatively great height. That is, the second device isolation layer 210 may be higher than the first device isolation layer 202. For example, the first device isolation layer 202 may be a shallow trench isolation (STI), and the second device isolation layer 210 may be a deep trench isolation (DTI).

The second device isolation layer 210 may be formed to fill a trench 205 extending between the first surface 201a and the second surface 201b of the semiconductor substrate 200. In some embodiments, the trench 205 may extend from the first surface 201a to the second surface 201b, of the semiconductor substrate 200, but is not limited thereto. In some embodiments, the trench 205 may extend from the first surface 201a towards the second surface 201b of the semiconductor substrate 200, but may not extend up to the second surface 201b. In some embodiments, the trench 205 may extend from the second surface 201b towards the first surface 201a of the semiconductor substrate 200, but may not extend up to the first surface 201a. Accordingly, the second device isolation layer 210 may extend from any one surface of the first surface 201a and the second surface 201b of the semiconductor substrate 200 towards another surface, or may extend from just the first surface 201a to the second surface 201b.

The first device isolation layer 202 may be formed of, for example, oxide, nitride, oxynitride, or a combination thereof. The second device isolation layer 210 may be formed of, for example, oxide, nitride, oxynitride, or a combination thereof. In some embodiments, the second device isolation layer 210 may cover a core isolation layer formed of a metal or a semiconductor material and a side wall of the core isolation layer, and may include a cover isolation layer formed of an insulation material such as a high-k dielectric.

A wire structure 220 is disposed on the first surface 201a of the semiconductor substrate 200. The wire structure 220 may include a front side interlayer insulating layer 221 and a plurality of front side wires 223. The front side interlayer insulating layer 221 may include a high density plasma (HDP) oxide, a TEOS oxide, a Tonen SilaZene (TOSZ), a spin on glass (SOG), an undoped silica glass (USG), a low-k dielectric material, or the like. The front side wires 223 may include, for example, a metal material or a conductive metal nitride such as copper (Cu), aluminum (Al), titanium (Ti), titanium nitride (TiN), or tungsten (W).

In some embodiments, a supporting layer 208 may be attached on the wire structure 220. The supporting layer 208 may be used to enhance the strength of the semiconductor substrate 200 that is thinned due to a polishing process. The supporting layer 208 may be formed of, for example, silicon oxide, silicon nitride and/or a semiconductor material. In some embodiments, the supporting layer 208 may be omitted.

The wire structure 220 may include a contact via 213 contacting the storage node region 206 and extending in the wire structure 220, and a buffer layer 217 disposed in the wire structure 220 and contacting the contact via 213. Thus, the buffer layer 217 may be electrically connected to the storage node region 206 formed in the semiconductor substrate 200 through the contact via 213. The buffer layer 217 may include, for example, a metal material such as copper (Cu), aluminum (Al), titanium (Ti), a conductive metal nitride such as titanium nitride (TiN), or carbon nanotube.

In some embodiments, a horizontal area of the contact via 213 may be gradually increased as it gets farther away from the first surface 201a of the semiconductor substrate 200. The contact via 213 may be formed of, for example, a metal or a conductive metal nitride such as copper (Cu), aluminum (Al), titanium (Ti), titanium nitride (TiN), or tungsten (W). In some embodiments, between the contact via 213 and the front side interlayer insulating layer 221, a protection insulating layer (not shown) may be disposed. The protection insulating layer may be formed of oxide or nitride.

In some portions of the isolation region IR of the image sensor 100, a via hole 225 may be formed, extending through the semiconductor substrate 200 from the second surface 201b to the first surface 201a of the semiconductor substrate 200. In some embodiments, the via hole 225 may extend from the second surface 201b of the semiconductor substrate 200 to the buffer layer 217. In some embodiments, the via hole 225 may be formed to pass through the first device isolation layer 202.

A side surface insulating layer 227 may be formed at a side surface of the via hole 225. The side surface insulating layer 227 may be formed of oxide or nitride. The via hole 225 may be filled with a first via plug 229. The first via plug 229 may fully fill the via hole 225 to contact the side surface insulating layer 227. Thus, the first via plug 229 may pass through the semiconductor substrate 200. The first via plug 229 may be formed of, for example, a metal or a conductive metal nitride such as copper (Cu), aluminum (Al), titanium (Ti), titanium nitride (TiN), or tungsten (W).

In some embodiments, some of the via hole 225, the side surface insulating layer 227, and the first via plug 229 may separately constitute portions formed in the semiconductor substrate 200 and portions formed in the wire structure 220.

The side surface insulating layer 227 and the first via plug 229 may be collectively referred to as a penetrating via structure 227 and 229.

Over the second surface 201b of the semiconductor substrate 200, a color filter layer 240 may be formed between antireflective layers 230. The color filter layer 240 may allow light that is incident through a micro lens 286 to pass, and light with a required wavelength may only be incident to the photoelectric conversion device 204 through the second surface 201b.

In some embodiments, the color filter layer 240 may include a first color filter layer 242 and a second color filter layer 244. Each of the first unit pixel UPX1 and the second unit pixel UPX2 may respectively include the first color filter layer 242 and the second color filter layer 244 corresponding to the photoelectric conversion device 204 formed in each thereof. In some embodiments, the first color filter layer 242 included in the first unit pixel UPX1 may be a red (R) color filer, and the second color filter layer 244 included in the second unit pixel UPX2 may be a blue (B) color filter. Accordingly, in the first unit pixel UPX1, red light wavelength may pass through the first color filter layer 242 to reach the photoelectric conversion device 204. Furthermore, in the second unit pixel UPX2, blue light wavelength may pass through the second color filter layer 244 to reach the photoelectric conversion device 204.

Over the second surface 201b of the semiconductor substrate 200, a first cover insulating layer 234 covering the color filter layer 240 may be formed. The first cover insulating layer 234 may be formed of, for example, an oxide, a nitride, a low-k dielectric, a resin, or a combination thereof. In some embodiments the first cover insulating layer 234 may have a multi-layered structure. In some embodiments, some portions of the first cover insulating layer 234 may be disposed between the color filter layer 240 and the antireflective layer 230. In some embodiments, the color filter layer 240 may contact the antireflective layer 230.

In the first cover insulating layer 234, a second via plug 252 electrically connected to the first via plug 229 and passing through the first cover insulating layer 234 may be formed. The second via plug 252 may extend from an upper surface of the first cover insulating layer 234 to a bottom surface of the first cover insulating layer 234. The second via plug 252 may be formed as an integral part from the upper surface to the bottom surface of the first cover insulating layer 234, but is not limited thereto. For example, the second via plug 252 may be formed in a multi-layered structure from the upper surface to the bottom surface of the first cover insulating layer 234. The second via plug 252 may be formed of, for example, a metal or a conductive metal nitride such as copper (Cu), aluminum (Al), titanium (Ti), titanium nitride (TiN), or tungsten (W). At least some portions of the second via plug 252 may be formed of a transparent conductive material. In some embodiments, the second via plug 252 may be formed with a first portion including a metal material, and a second portion disposed on the first portion and including a transparent conductive material. The second portion of the second via plug 252 may form an integral part with a lower transparent electrode layer 272, which will be described herein later. In this case, the second via plug 252 may extend from the lower transparent electrode layer 272 to the second surface 201b of the semiconductor substrate 200, and may be a portion of a conductive material electrically connecting the lower transparent electrode layer 272 and the first via plug 229 to each other.

The lower transparent electrode layer 272 may be formed over the first cover insulating layer 234. The lower transparent electrode layer 272 may be formed as a plurality of parts spaced apart from each other to respectively correspond to a plurality of photoelectric conversion devices 204. The lower transparent electrode layer 272 may be formed of, for example, a transparent conductive material such as ITO, IZO, ZnO, $SnO_2$, antimony-doped tin oxide (ATO), Al-doped zinc oxide (AZO), gallium-doped zinc oxide (GZO), $TiO_2$, or fluorine-doped tin oxide (FTO).

In some embodiments, the lower transparent electrode layer 272 may be formed by a damascene method. For example, the lower transparent electrode layer 272 may be formed in an upper side of the first cover insulating layer 234 to fill a plurality of recess spaces spaced apart from each other. A lower transparent electrode material may be formed to cover the first cover insulating layer 234. Some portions of the lower transparent electrode material may be removed to expose an upper surface of the first cover insulating layer 234. The lower transparent electrode layer 272 including a plurality of parts may be formed to respectively fill the plurality of recess spaces. An upper surface of the lower transparent electrode layer 272 and an uppermost surface of the first cover insulating layer 234 may be at a same level as each other. That is, the upper surface of the lower transparent electrode layer 272 and the upper surface of the first cover insulating layer 234 may form a flat surface and have a same height.

In some embodiments, a plurality of holes passing through at least some portions of the first cover insulating layer 234 may be formed from each of the recess spaces towards the substrate 200. The lower transparent electrode material filling the holes and the recess spaces and covering the first cover insulating layer 234 may be formed. Then, a dual damascene method in which some portions of the lower transparent electrode material are removed to expose an upper surface of the first cover insulating layer 234 may be performed. As a result, the lower transparent electrode layer 272 and at least some portions of the second via plug 252, which may be formed as an integral part with the lower transparent electrode layer 272, may be formed. In this case, as described above, at least some portions of the second via plug 252 may be formed of a transparent conductive material. When the second via plug 252 is formed with a first portion including a metal material, a second portion may be arranged on the first portion and including a transparent conductive material. The first portion of the second via plug 252 may be exposed at a bottom surface of the hole during a process of forming the recess space and the hole.

The lower transparent electrode layer 272 may be electrically connected to the first via plug 229. For example, the second via plug 252 may be disposed between the lower transparent electrode layer 272 and the first via plug 229. The lower transparent electrode layer 272 may be electrically connected to the second via plug 252, and the second via plug 252 may be electrically connected to the first via plug 229.

An organic photoelectric layer 274 may be formed on the lower transparent electrode layer 272. The organic photoelectric layer 274 may be formed as an integral part on a plurality of lower transparent electrode layers 272. The organic photoelectric layer 274 may be formed to cross over a flat surface, including an upper surface of the lower transparent electrode layer 272 and an upper surface of the first cover insulating layer 234 which are at a same level as each other. In some embodiments, the organic photoelectric layer 274 may be an organic material in which photoelectric conversion only occurs at a specific light wavelength. For example, photoelectric conversion may occur in the organic photoelectric layer 274 only at a green light wavelength. For example, the organic photoelectric layer 274 may present the maximum absorption wavelength λmax in a range of about 500 nm to about 600 nm.

The organic photoelectric layer 274 may be formed in a single-layer or a multi-layered form in which a p-type semiconductor material and an n-type semiconductor material are formed as a p-n flat junction or a bulk heterojunction. The organic photoelectric layer 274 may be a layer in which an exciton is generated after receiving incident light and then the generated exciton is divided into a hole and an electron. The p-type semiconductor material and the n-type semiconductor material may each absorb light in a green wavelength band, and present the maximum absorption peak in a wavelength band of about 500 nm to about 600 nm. The p-type semiconductor material and the n-type semiconductor material may each have a bandgap of about 1.5 eV to 3.5 eV, for example, a bandgap of about 2.0 eV to about 2.5 eV. As the p-type semiconductor material and the n-type semiconductor material have the bandgap with the range described above, light in a green wavelength band may be absorbed, and, particularly, the maximum absorption peak may be presented in a wavelength band of about 500 nm to about 600 nm.

The organic photoelectric layer 274 may be a single-layer or a multi-layered form. The organic photoelectric layer 274 may be various combinations such as, for example, an intrinsic layer (I layer), a p-type layer/I layer, an I layer/n-type layer, a p-type layer/I layer/n-type layer, a p-type layer/n-type layer, or the like. The intrinsic layer (I layer) may include the p-type semiconductor compound and the n-type semiconductor compound that are mixed at a ratio of about 1:100 to about 100:1. The p-type semiconductor compound and the n-type semiconductor compound may be included at a ratio of about 1:50 to about 50:1, at a ratio of about 1:10 to about 10:1, or at a ratio of about 1:1, from among the ratios described above. As the p-type semiconductor and the n-type semiconductor compounds have a formulation ratio described above, an exciton is effectively generated and a p-n flat junction is effectively formed. A p-type layer may include the p-type semiconductor compound, and an n-type layer may include the n-type semiconductor compound.

The organic photoelectric layer 274 may have, for example, a thickness of about 1 nm to about 500 nm. In some embodiments, the organic photoelectric layer 274 may have a thickness of about 5 nm to about 300 nm. As the organic photoelectric layer 274 effectively absorbs light, and effectively separates and delivers holes and electrons, the organic photoelectric layer 274 may have a thickness capable of effectively improving photoelectric conversion efficiency.

An upper transparent electrode layer 276 may be formed on the organic photoelectric layer 274. The upper transparent electrode layer 276 may be formed of, for example, ITO, IZO, ZnO, $SnO_2$, ATO, AZO, GZO, $TiO_2$, or FTO. The upper transparent electrode layer 276 may be formed as an integral part over an active pixel region APR and a black pixel region BPR. That is, the upper transparent electrode layer 276 may be formed as an integral part over the plurality of photoelectric conversion devices 204. In some embodiments, the upper transparent electrode layer 276 may be formed to cover all of an upper surface and a side surface of the organic photoelectric layer 274.

The upper transparent electrode layer 276 may be formed to extend as an integral part over the plurality of pixel regions PR. Thus, the lower transparent electrode layer 272, the organic photoelectric layer 274, and the upper transparent electrode layer 276 may be sequentially disposed over the semiconductor substrate 200.

In the present specification, a transparent electrode layer including a plurality of parts that are spaced apart from each other and respectively correspond to each of the unit pixel regions (e.g., the lower transparent electrode layer 272) may be referred to as a first transparent electrode layer. A transparent electrode layer formed as an integral part over the unit pixel regions (e.g., the upper transparent electrode layer 276) may be referred to as a second transparent electrode layer.

The first via plug 229 may be electrically connected to the storage node region 206. Thus, the storage node region 206 may be electrically connected to the lower transparent electrode layer 272 through the first via plug 229. In some embodiments, the first via plug 229 may be electrically connected to the buffer layer 217, and the buffer layer 217 may be electrically connected to the storage node region 206 through the contact via 213.

In this regard, charge generated by photoelectric conversion that is caused by light absorbed in the organic photoelectric layer 274 may be stored in the storage node region 206 through the lower transparent electrode layer 272 and the first via plug 229.

Since the first via plug 229 is in the isolation region IR, there is no need for a space for forming the first via plug 229, in the unit pixel UPX. Thus, a horizontal area of the unit pixel UPX is secured, and photoelectric conversion efficiency of the image sensor 100 may be improved.

Furthermore, a side surface of the first via plug 229 is covered by the side surface insulating layer 227, and thus, even when the first via plug 229 is disposed in the isolation region IR, an electrical and optical crosstalk between adjacent unit pixels UPX may not occur. In other words, the second device isolation layer 210, the side surface insulating layer 227 and the first via plug 229 formed in the isolation region IR between adjacent pixel regions PR may collectively constitute a device isolation structure for preventing an electrical and optical crosstalk between adjacent unit pixels UPX.

A second cover insulating layer 282 may be formed on the upper transparent electrode layer 276. The second cover insulating layer 282 may be formed of a transparent insulation material. The second cover insulating layer 282 may be formed of, for example, a silicon oxide or a metal oxide.

In some embodiments, a third cover insulating layer 284 may be formed on the second cover insulating layer 282. The third cover insulating layer 284 may be formed of a transparent insulation material. The third cover insulating layer 284 may be formed of, for example, a silicon oxynitride. In some embodiments, the third cover insulating layer 284 may be omitted.

The micro lens 286 corresponding to the color filter layer 240 may be formed on the third cover insulating layer 284. In some embodiments, when the third cover insulating layer 284 is omitted, the micro lens 286 may be formed on the second cover insulating layer 282. The micro lens 286 may be formed to overlap the corresponding color filter layer 240. The micro lens 286 may be formed as a plurality of parts to correspond to a plurality of color filter layers 240. The micro lens 286 may change a path of light incident through a region other than the photoelectric conversion device 204 and then concentrate the light into the photoelectric conversion device 204.

Figure 2A:
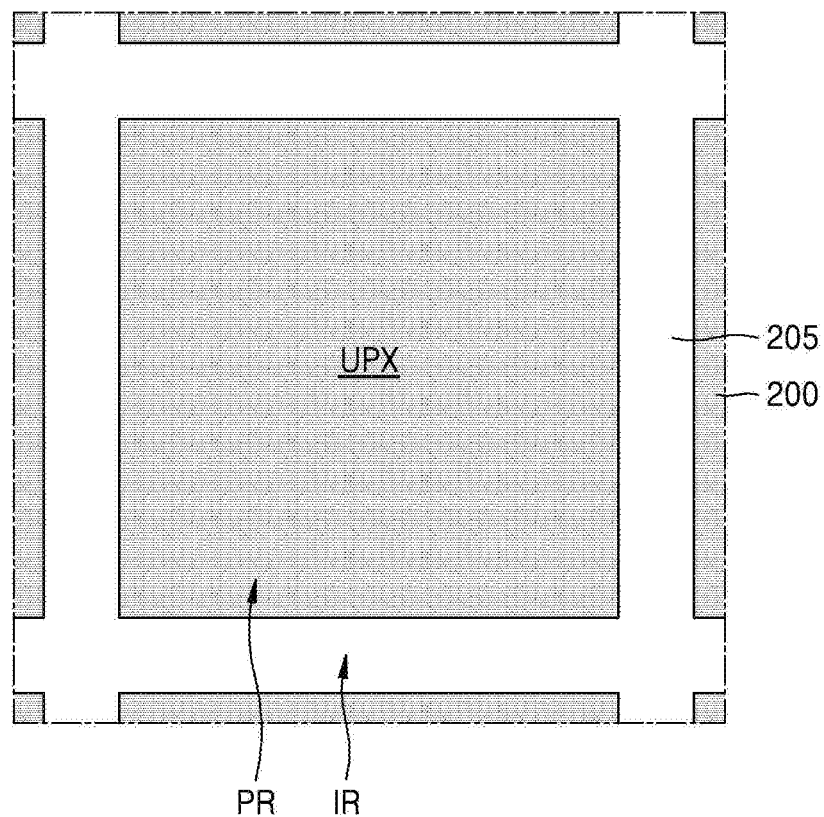
FIG. 2A to 2D illustrate horizontal cross-sectional views showing a method of manufacturing an image sensor, according to an embodiment.
Figure 2B:
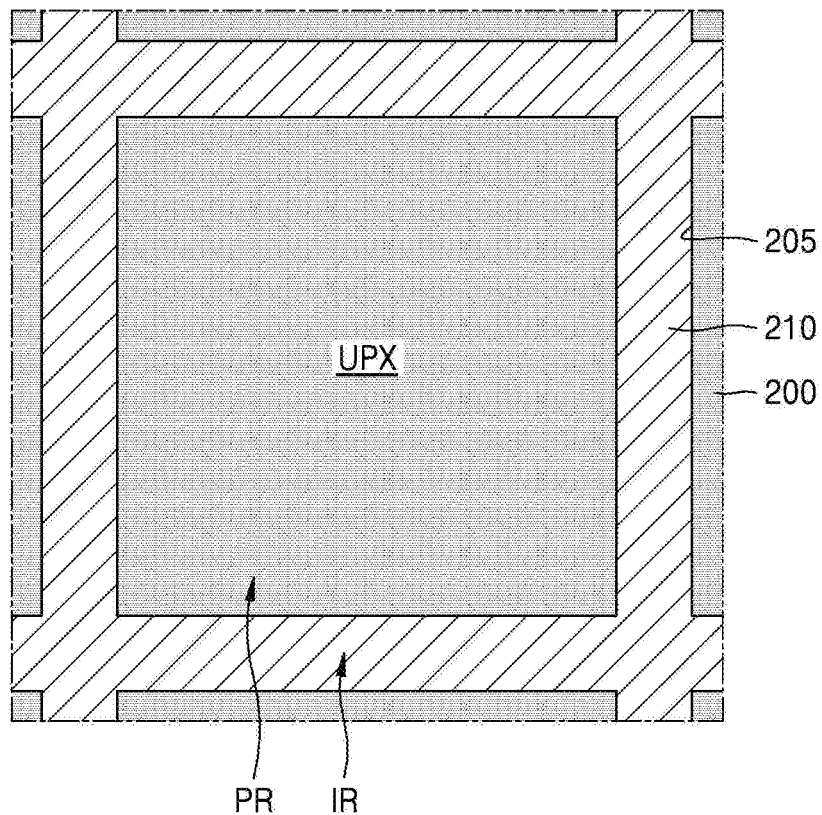
Figure 2C:
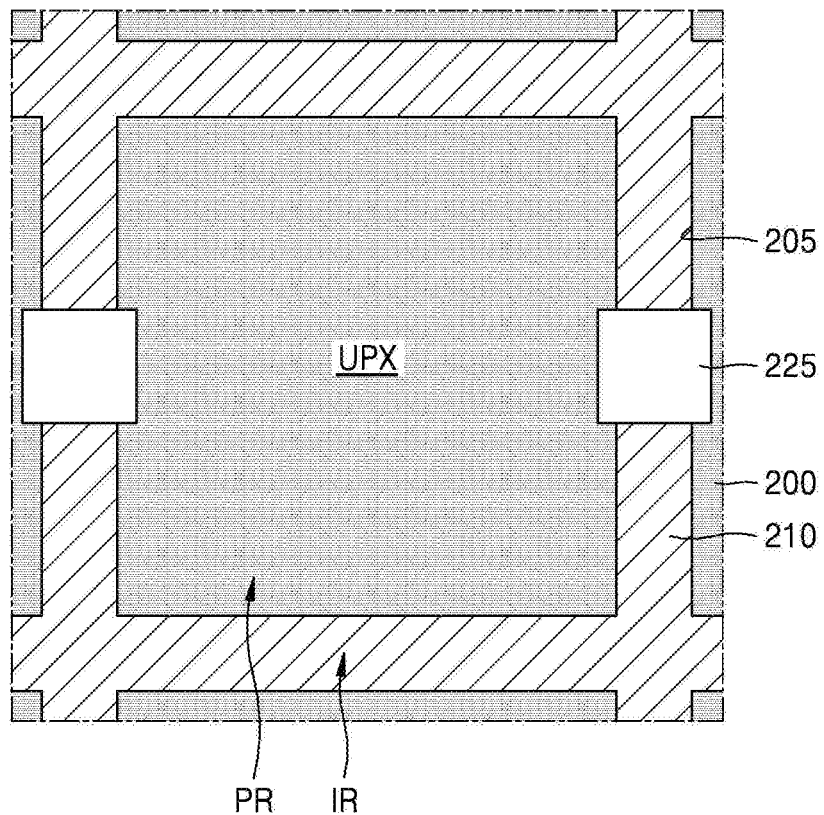
Figure 2D:
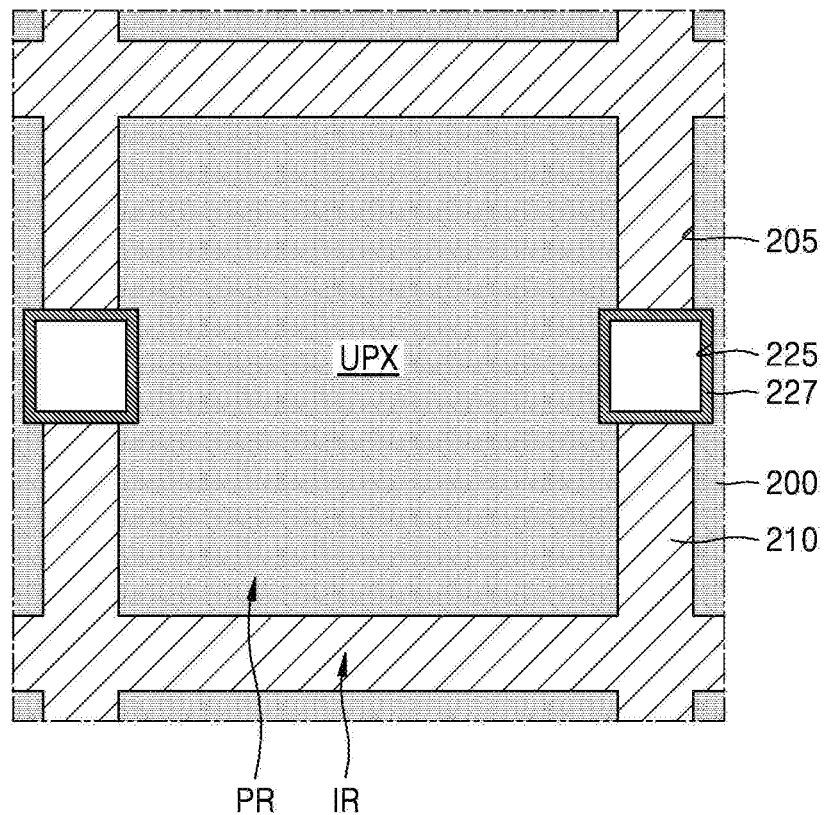
Figure 3A:
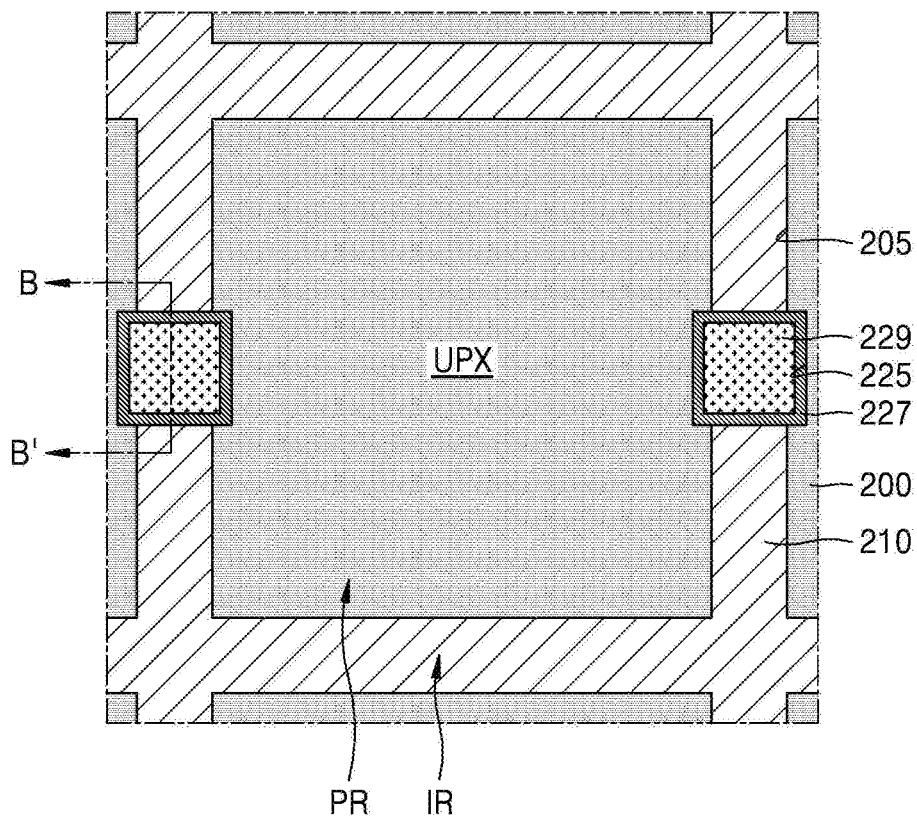
FIGS. 3A and 3B respectively illustrate a horizontal cross-sectional view of a portion of an image sensor according to an embodiment and a vertical cross-sectional view of some enlarged portions thereof.
Figure 3B:
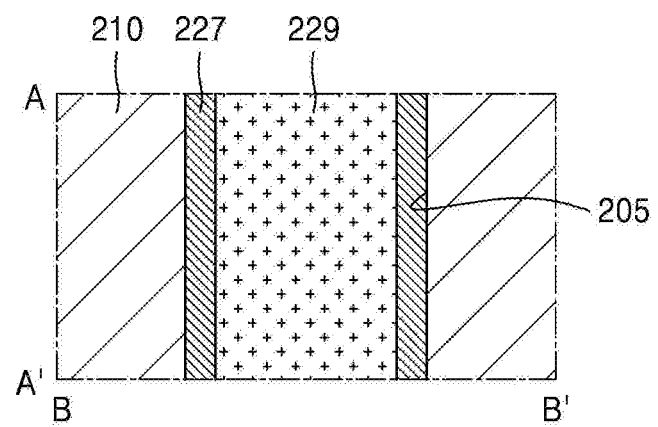

FIGS. 2A to 2D illustrate horizontal cross-sectional views showing a method of manufacturing an image sensor according to an example embodiment, and FIGS. 3A and 3B respectively illustrate a horizontal cross-sectional view of a portion of an image sensor according to an example embodiment and an enlarged vertical cross-sectional view showing some portions thereof. In detail, FIGS. 2A to 2D, and FIG. 3A are horizontal cross-sectional views taken along a line A-A' of FIGS. 1A and 1B in a direction parallel to the first surface 201*a* of the semiconductor substrate 200, and FIG. 3B is a vertical cross-sectional view showing an enlarged portion taken along a line A-A' of FIGS. 1A and 1B and a line B-B' of FIG. 3A. Configuration components of FIGS. 1A and 1B may also be referred to herebelow.

Referring to FIG. 2A, some portions of the semiconductor substrate 200 are removed to form the trench 205. The trench 205 may extend in a vertical direction between the first surface 201*a* and the second surface 201*b* of the semiconductor substrate 200. The trench 205 may be formed to surround the unit pixel UPX. In some embodiments, the trench 205 may be formed to be continuously connected so as to fully surround an edge of the unit pixel UPX. The trench 205 may be formed in the isolation region IR disposed between adjacent pixel regions PR. In some embodiments, the trench 205 may be formed to extend from the first surface 201*a* to the second surface 201*b* of the semiconductor substrate 200. In some embodiments, the trench 205 may be formed to extend from the first surface 201*a* towards the second surface 201*b* of the semiconductor substrate 200, but may not extend up to the second surface 201*b*. In some embodiments, the trench 205 may extend from the second surface 201*b* towards the first surface 201*a* of the semiconductor substrate 200, but may not extend up to the first surface 201*a*.

In some embodiments, the first device isolation layer 202 may be formed earlier than the trench 205.

Referring to FIG. 2B, the second device isolation layer 210 filling the trench 205 is formed as follows. An insulation material layer may be formed to fill the trench 205 and cover the semiconductor substrate 200. Then, some portions of the insulation material layer, formed in a region other than an inner portion of the trench 205, may be removed to form the second device isolation layer 210.

In some embodiments, after the second device isolation layer 210 is formed, configuration components in the unit pixel UPX (e.g., the photoelectric conversion device 204, the storage node region 206, and the wire structure 220) may be formed.

Referring to FIG. 2C, the via hole 225 extending from the second surface 201*b* to the first surface 201*a* of the semiconductor substrate 200, by passing through the semiconductor substrate 200, is formed. In some embodiments, the via hole 225 may extend from the second surface 201*b* of the semiconductor substrate 200 into the wire structure 220, for example, to reach the buffer layer 217.

The via hole 225 may be formed to disconnect some portions of the second device isolation layer 210 surrounding the unit pixel UPX by removing some portions of the second device isolation layer 210. In some embodiments, the via hole 225 may be formed by removing some portions of the semiconductor substrate 200 which are adjacent to the removed portions of the second device isolation layer 210.

Referring to FIG. 2D, the side surface insulating layer 227 covering an inner side surface of the via hole 225 is formed. An insulation material layer may be formed to conformally cover an inner side and bottom surfaces of the via hole 225 and the second surface 201*b* of the semiconductor substrate, and then some portions of the insulation material layer, formed in a region other than the inner side surface of the via hole 225, may be removed to form the side surface insulating layer 227. Thus, the side surface insulating layer 227 may not cover the bottom surface of the via hole 225.

Referring to FIGS. 3A and 3B, the first via plug 229 filling the via hole 225 of which an inner side surface is covered by the side surface insulating layer 227 is formed. Next, the color filter layer 240, the lower transparent electrode layer 272, the organic photoelectric layer 274, the upper transparent electrode layer 276, the micro lens 286, and the like described with reference to FIGS. 1A and 1B may be formed to constitute the image sensor 100.

The image sensor 100 includes a plurality of pixel regions PR spaced apart from each other, and each of the plurality of pixel regions PR has the unit pixel UPX and the semiconductor substrate 200 including the isolation region IR between adjacent pixel regions PR.

The first via plug 229 may be disposed between the second device isolation layers 210 in the isolation region IR and pass through the semiconductor substrate 200. The side surface insulating layer 227 may cover a side surface of the first via plug 229 to surround the first via plug 229.

The first via plug 229 may be electrically connected to the unit pixel UPX. In detail, the first via plug 229 may electrically connect the lower transparent electrode layer 272 and the storage node region 206 so that, as described with reference to FIGS. 1A and 1B, charge generated by a photoelectric conversion that is caused by light absorbed in the organic photoelectric layer 274 may be delivered to the storage node region 206 in the unit pixel UPX.

Between the first via plug 229 and the second device isolation layer 210, the side surface insulating layer 227 covering a side surface of the via hole 225 may be disposed. In a direction between two adjacent unit pixels UPX, a width of the via hole 225 may be greater than a width of the second device isolation layer 210. In other words, between two adjacent unit pixels UPX, a total width of the side surface insulating layer 227 and the first via plug 229 (e.g., a width of the penetrating via structure 227 and 229) may be greater than the width of the second device isolation layer 210.

Thus, the unit pixel UPX may be entirely surrounded by the second device isolation layer 210, the first via plug 229, and the side surface insulating layer 227. As a result, due to the second device isolation layer 210, the first via plug 229, and the side surface insulating layer 227, electrical and optical crosstalk between adjacent unit pixels UPX may not occur.

The first via plug 229 is disposed between two adjacent unit pixels UPX and may electrically connect the lower transparent electrode layer 272 disposed in one of two adjacent unit pixels UPX and the storage node region 206 to each other.

Figure 4A:
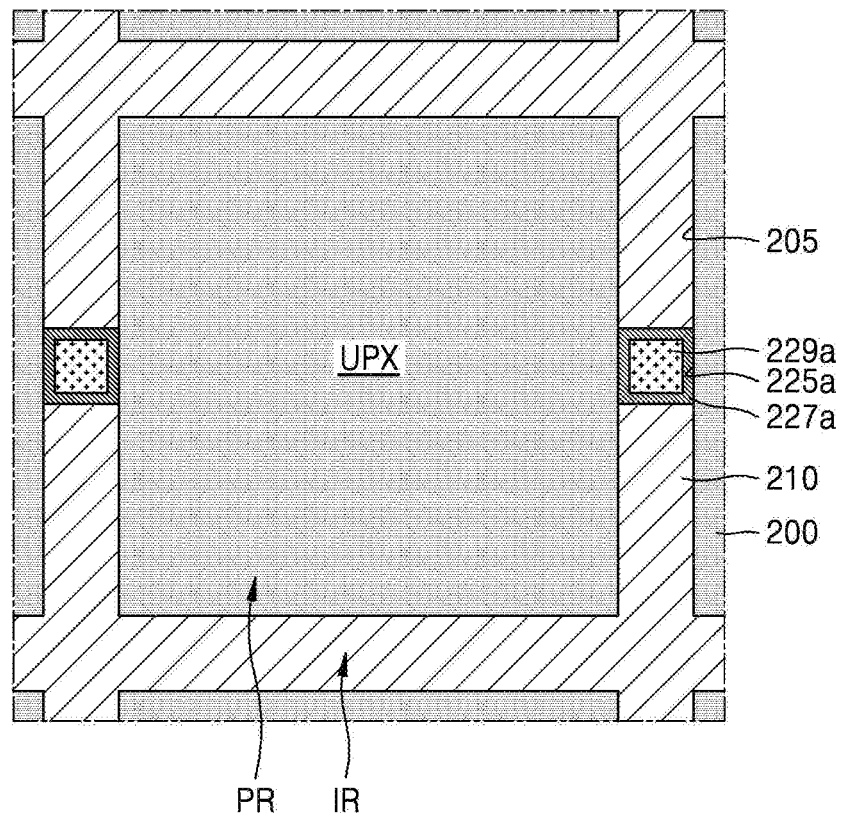
FIGS. 4A to 4C illustrate horizontal cross-sectional views of a portion of an image sensor according to an embodiment.
Figure 4B:
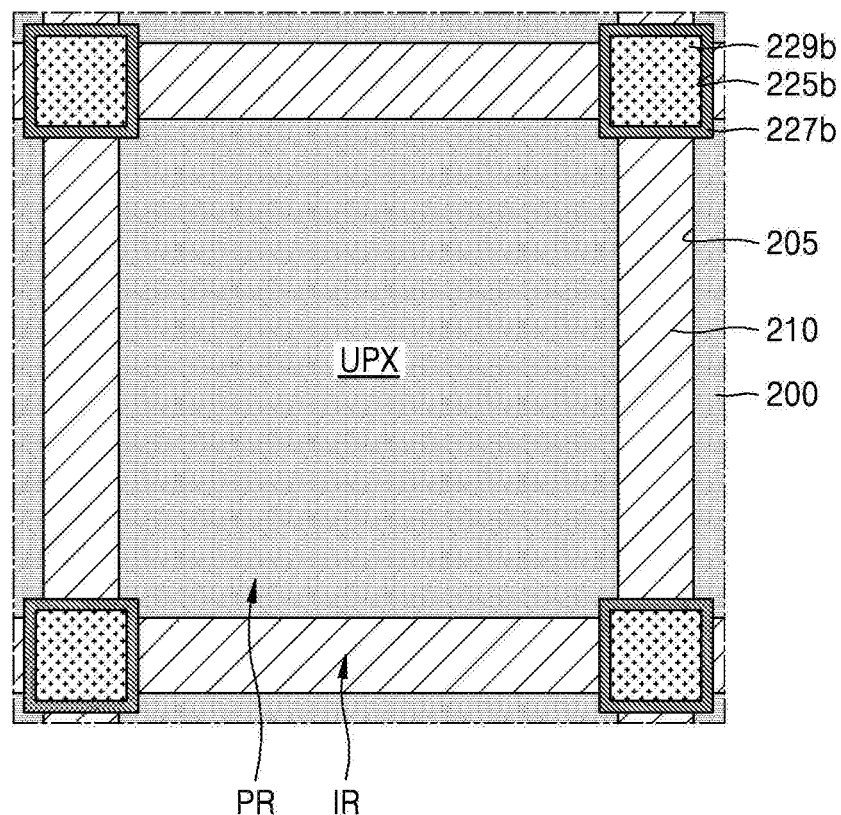
Figure 4C:
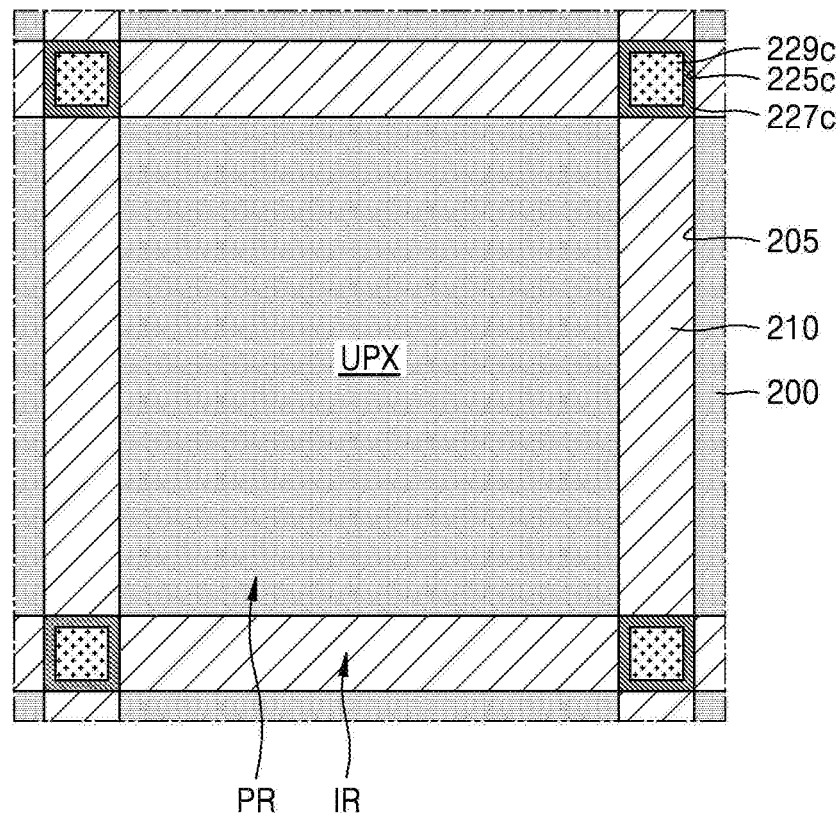

FIGS. 4A to 4C illustrate horizontal cross-sectional views of a portion of an image sensor according to an example embodiment.

Referring to FIG. 4A, the image sensor 100a includes the second device isolation layer 210, a side surface insulating layer 227a, and a first via plug 229a disposed in the isolation region IR. The side surface insulating layer 227a may cover an inner side surface of a via hole 225a, and the first via plug 229a may fill an inside of the via hole 225a of which an inner side surface is covered by the side surface insulating layer 227a. Between two adjacent unit pixels UPX, a width of the via hole 225a may be formed to be the same as a width of the second device isolation layer 210. In other words, between two adjacent unit pixels UPX, a total width of the side surface insulating layer 227a and the first via plug 229a may be the same as a width of the second device isolation layer 210.

Referring to FIG. 4B, an image sensor 100b includes the second device isolation layer 210, a side surface insulating layer 227b, and a first via plug 229B disposed in the isolation region IR.

A via hole 225b and the first via plug 229B are disposed between four adjacent unit pixels UPX, and the first via plug 229B may electrically connect the lower transparent electrode layer 272 disposed in any one of the four adjacent unit pixels UPX and the storage node region 206 to each other.

In other words, in the image sensor 100 of FIG. 3A, the first via plug 229 is located at a side line of the unit pixel UPX, but in the image sensor 100b of FIG. 4B, the first via plug 229B may be located at a corner of the unit pixel UPX.

Referring to FIG. 4C, an image sensor 100c includes the second device isolation layer 210, a side surface insulating layer 227c and a first via plug 229c disposed in the isolation region IR.

The first via plug 229c may be disposed between four adjacent unit pixels UPX. A width of a via hole 225c may be formed to be the same as a width of the second device isolation layer 210. In other words, a total width of the side surface insulating layer 227c and the first via plug 229c may be the same as a width of the second device isolation layer 210.

Figure 5:
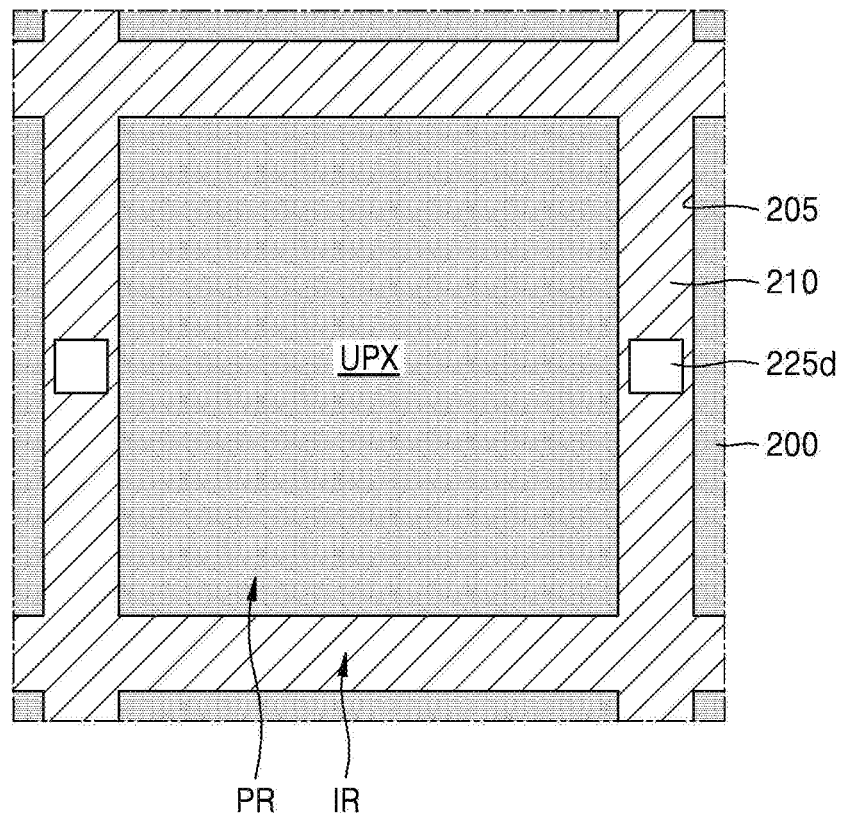
FIG. 5 illustrates a horizontal cross-sectional view showing a method of manufacturing an image sensor, according to an embodiment.
Figure 6A:
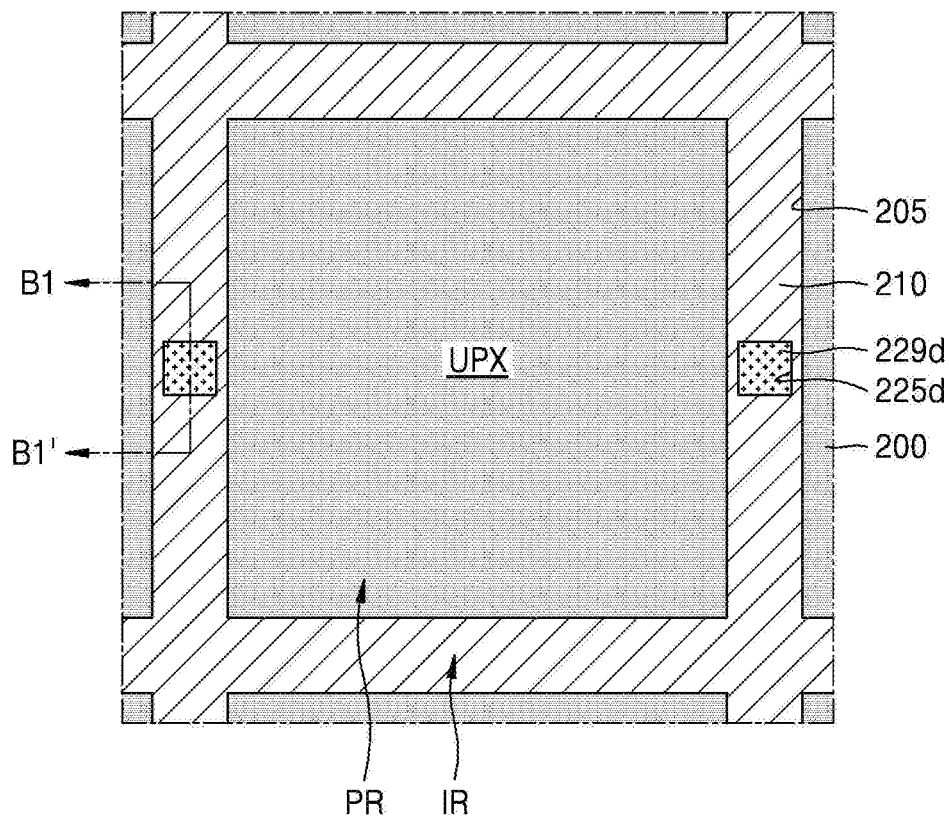
FIGS. 6A and 6B respectively illustrate a horizontal cross-sectional view of a portion of an image sensor according to an embodiment and a vertical cross-sectional view of enlarged some portions thereof.
Figure 6B:
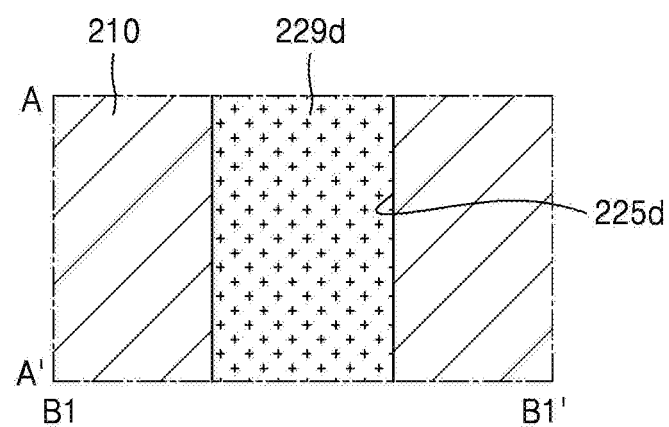

FIG. 5 illustrates a horizontal cross-sectional view showing a method of manufacturing an image sensor according to an example embodiment, and FIGS. 6A and 6B respectively illustrate a horizontal cross-sectional view of a portion of an image sensor according to an example embodiment and an enlarged vertical cross-sectional view showing some portions thereof. In detail, FIG. 5 is a horizontal cross-sectional view showing a process after the process shown in FIG. 2B, and configuration components of FIGS. 1A and 1B may also be referred to herebelow. Also, FIG. 6B is a vertical cross-sectional view showing an enlarged portion taken along a line A-A' of FIGS. 1A and 1B and a line B1-B1' of FIG. 6A.

Referring to FIG. 5, a via hole 225d extending from the second surface 201b to the first surface 201a of the semiconductor substrate 200, by passing through the semiconductor substrate 200 is formed. In some embodiments, the via hole 225d may extend from the second surface 201b of the semiconductor substrate 200 into the wire structure 220, for example, up to the buffer layer 217.

Between two adjacent unit pixels UPX, a width of the via hole 225d may be formed to be smaller than a width of the second device isolation layer 210. That is, some portions of the second device isolation layer 210 may remain between a portion of the semiconductor substrate 200 disposed in the unit pixel UPX and the via hole 225d.

In this regard, some portions of the semiconductor substrate 200 disposed in the unit pixel UPX are exposed through some portions of an inner side surface of the via hole 225 of FIG. 2C, and the second device isolation layer 210 may only be exposed through an inner side surface of the via hole 225d of FIG. 5.

Referring to FIGS. 6A and 6B, a first via plug 229d filling the via hole 225d is formed to constitute an image sensor 100d. Between two adjacent unit pixels UPX, a width of the first via plug 229d may be smaller than a width of the second device isolation layer 210. A portion of the second device isolation layer 210, located along an inner side surface of the via hole 225d, may insulate the first via plug 229d from the semiconductor substrate 200, and thus, the side surface insulating layer 227 as described in FIG. 3A may not be separately formed. In this regard, the first via plug 229d and the second device isolation layer 210 may directly contact each other. As a result, the first via plug 229d and a portion of the second device isolation layer 210 that covers a side surface of the first via plug 229d to surround the first via plug 229d may serve as a penetrating via structure.

Figure 7:
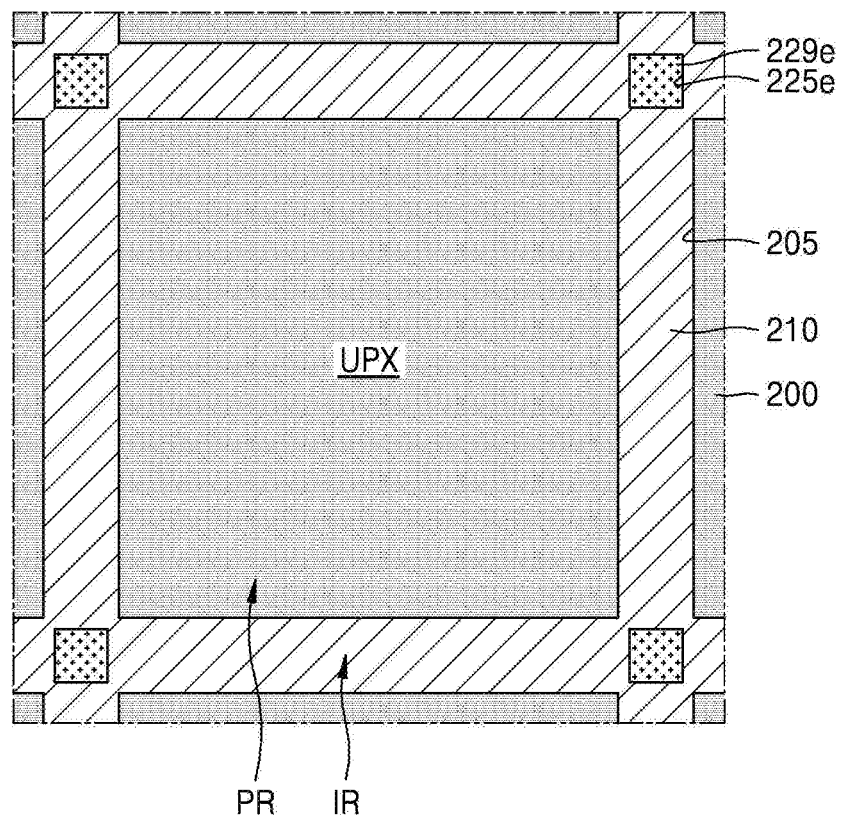
FIG. 7 illustrates a horizontal cross-sectional view of a portion of an image sensor according to an embodiment.

FIG. 7 illustrates a horizontal cross-sectional view of a portion of an image sensor according to an example embodiment.

Referring to FIG. 7, in an image sensor 100e, a via hole 225e and a first via plug 229e are disposed between four adjacent unit pixels UPX, and the first via plug 229e may electrically connect the lower transparent electrode layer 272 disposed in one of the four adjacent unit pixels UPX and the storage node region 206 to each other.

Figure 8A:
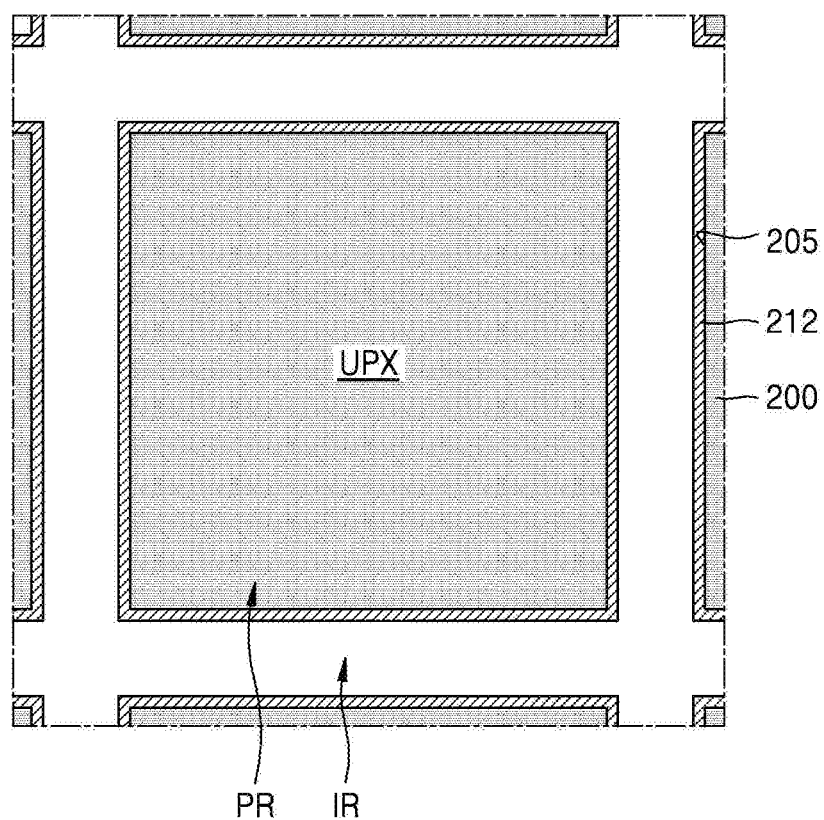
FIGS. 8A and 8B illustrate horizontal cross-sectional views showing a method of manufacturing an image sensor, according to an embodiment.
Figure 8B:
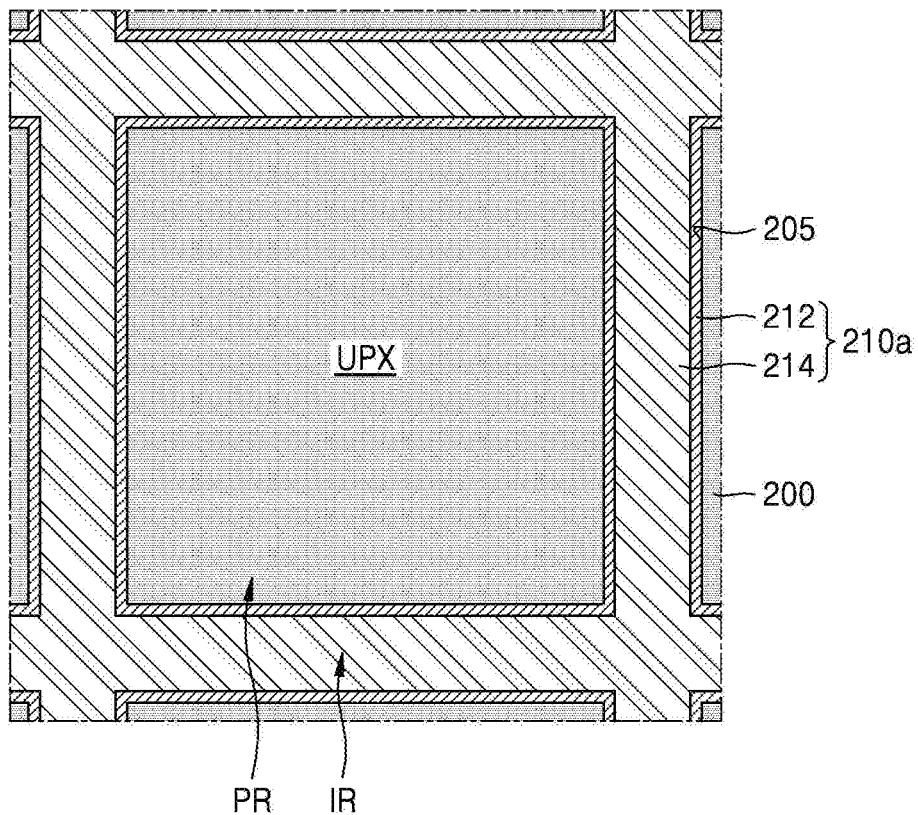
Figure 9A:
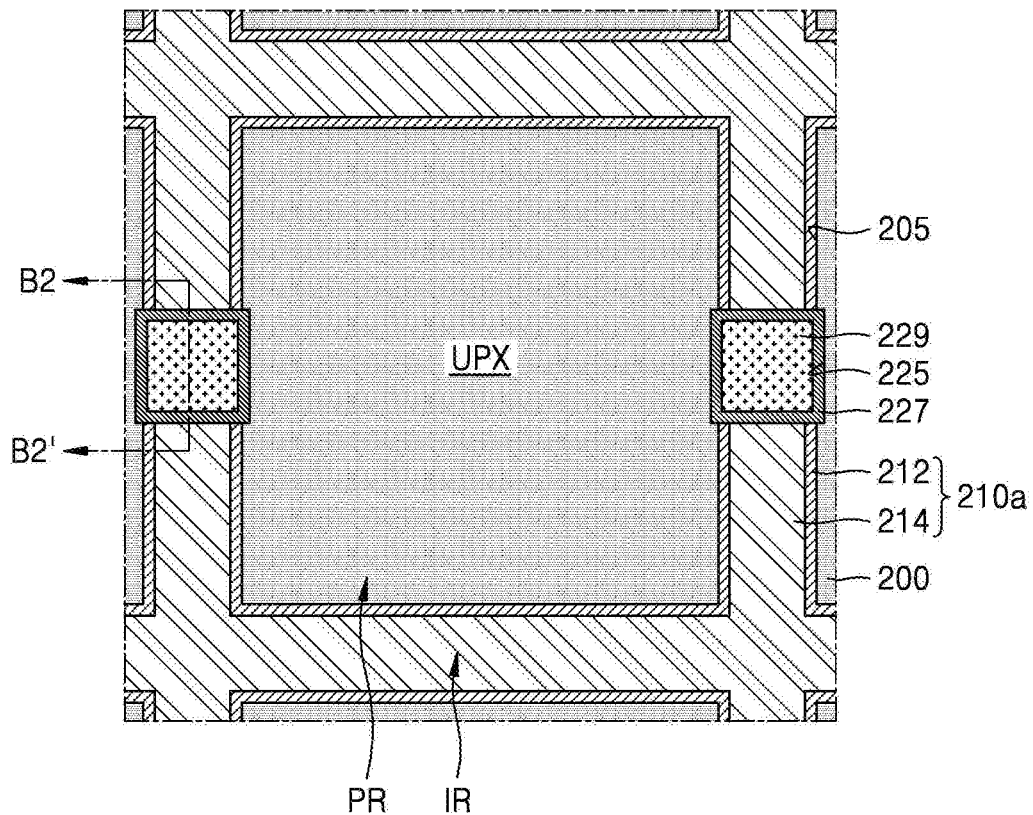
FIGS. 9A and 9B respectively illustrate a horizontal cross-sectional view of a portion of an image sensor according to an embodiment and a vertical cross-sectional view of enlarged some portions thereof.
Figure 9B:
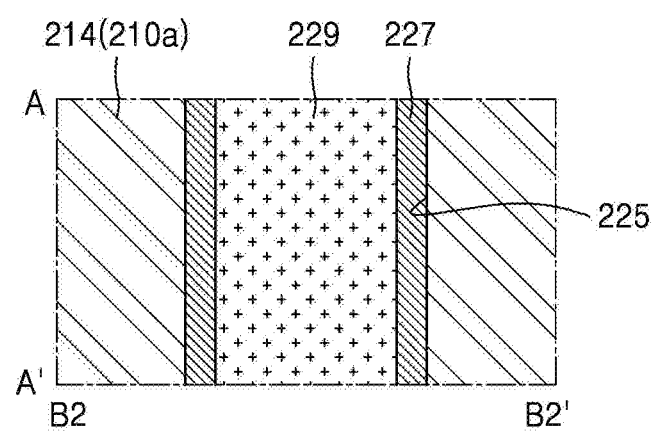

FIGS. 8A and 8B illustrate horizontal cross-sectional views showing a method of manufacturing an image sensor according to an example embodiment, and FIGS. 9A and 9B respectively illustrate a horizontal cross-sectional view of a portion of an image sensor according to an example embodiment and an enlarged vertical cross-sectional view showing some portions thereof. In detail, FIG. 8A is a horizontal cross-sectional view showing a process after the process shown in FIG. 2A, and FIG. 9B is a vertical cross-sectional view showing an enlarged portion taken along a line A-A' of FIGS. 1A and 1B and a line B2-B2' of FIG. 9A. Configuration components of FIGS. 1A and 1B may also be referred to herebelow.

Referring to FIG. 8A, a cover isolation layer 212 covering an inner side surface of the trench 205 is formed. For example, the cover isolation layer 212 may have a dielectric constant of about 10 to about 25. In some embodiments, the cover isolation layer 212 may be formed of at least one material selected from hafnium oxide (HfO), hafnium silicon oxide (HfSiO), hafnium oxynitride (HfON), hafnium silicon oxynitride (HfSiON), lanthanum oxide (LaO), lanthanum aluminum oxide (LaAlO), zirconium oxide (ZrO), zirconium silicon oxide (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), or lead scandium tantalum oxide (PbScTaO).

In some embodiments, the cover isolation layer 212 may cover both of an inner side surface and a bottom surface of the trench 205.

Referring to FIG. 8B, a core isolation layer 214 filling the trench 205 of which an inner side surface is covered by the cover isolation layer 212 is formed, and then a second device isolation layer 210a including the cover isolation layer 212 and the core isolation layer 214 is formed. In some embodiments, the core isolation layer 214 may be formed of a conductive material. The core isolation layer 214 may be formed of, for example, a semiconductor material such as polysilicon, at least one metal selected from Ti, Ta, Al, W, Ru, Nb, Mo, Hf, Ni, Co, Pt, Yb, Tb, Dy, Er, and Pd, a metal nitride including at least one metal, a metal doped with carbon, or a metal compound such as a metal nitride doped with carbon.

Referring to FIGS. 9A and 9B, in a method similar to the method described with reference to FIGS. 2C, 2D, and 3A, the via hole 225, the side surface insulating layer 227 covering an inner side surface of the via hole 225, and the first via plug 229 filling an inside of the via hole 225 of which an inner side surface is covered by the side surface insulating layer 227 are formed to constitute an image sensor 100f.

Between the core isolation layer 214 of the second device isolation layer 210a and the first via plug 229, the side surface insulating layer 227 covering a side surface of the via hole 225 may be disposed. In other words, the side surface insulating layer 227 may directly contact the core isolation layer 214.

In the second device isolation layer 210a, the cover isolation layer 212 may prevent an electrical crosstalk between adjacent unit pixels UPX, and the core isolation layer 214 may prevent an optical crosstalk. Also, the side surface insulating layer 227 may prevent an electrical crosstalk between adjacent unit pixels UPX with the cover isolation layer 212, and the first via plug 229 may prevent an optical crosstalk with the core insulating layer.

The first via plug 229 may be electrically connected to the unit pixel UPX. In detail, as described with reference to FIGS. 1A and 1B, the first via plug 229 may electrically connect the lower transparent electrode layer 272 and the storage node region 206 so that charge generated by a photoelectric conversion that is caused by light absorbed in the organic photoelectric layer 274 are delivered to the storage node region 206 included in the unit pixel UPX. Otherwise, when the core isolation layer 214 has conductivity, the first via plug 229 may be electrically connected to the unit pixel UPX.

Figure 10A:
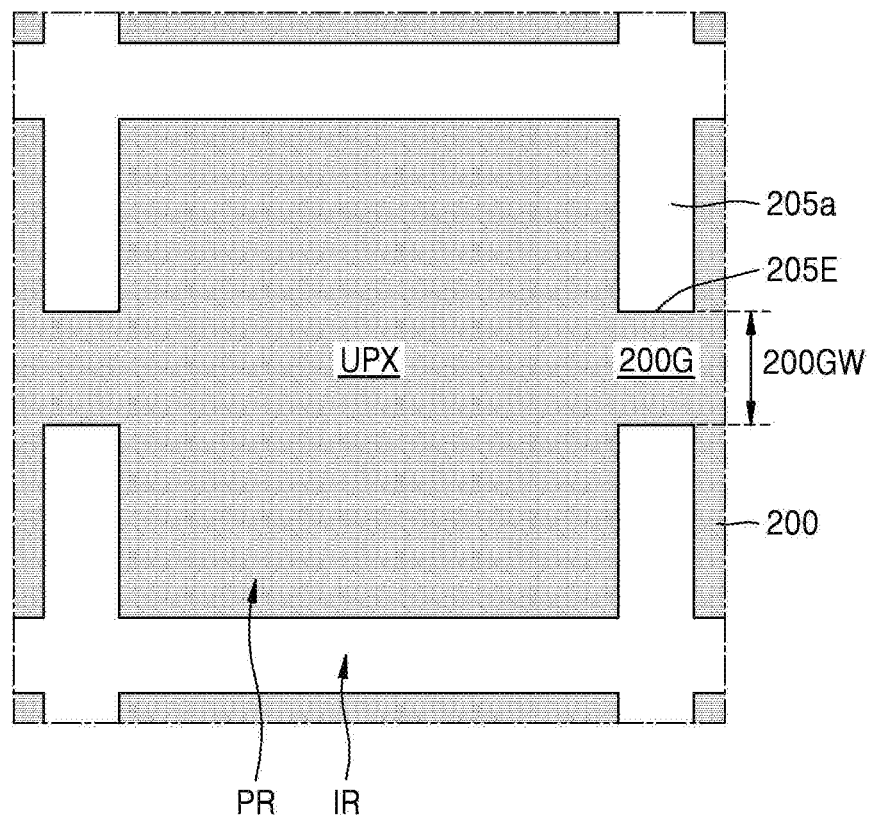
FIGS. 10A to 10D illustrate horizontal cross-sectional views showing a method of manufacturing an image sensor, according to an embodiment.
Figure 10B:
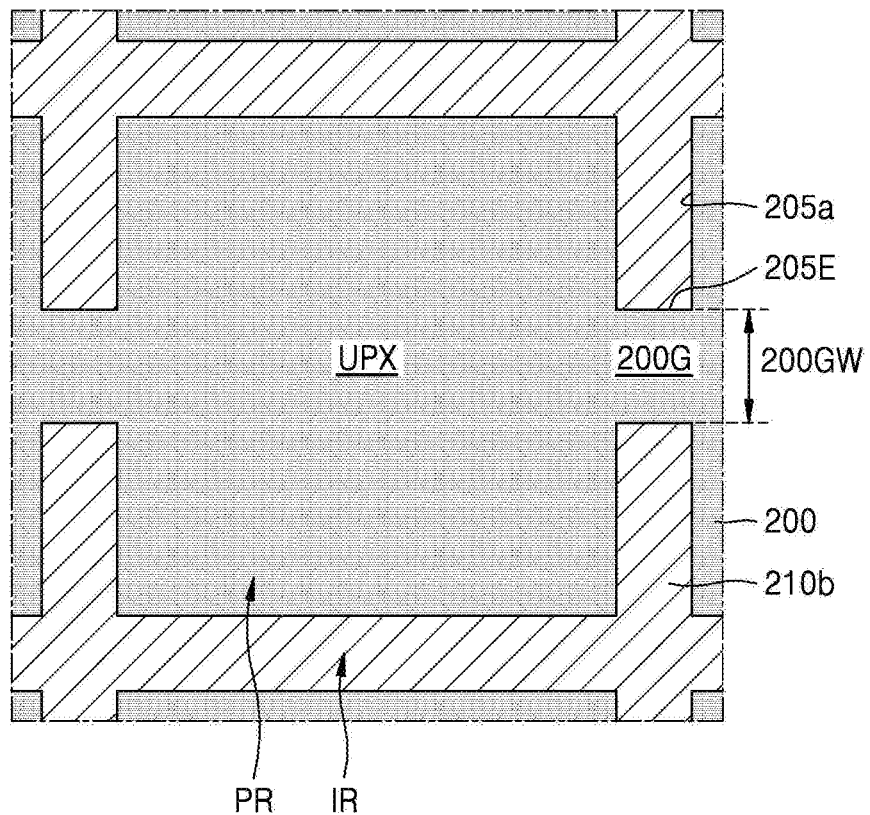
Figure 10C:
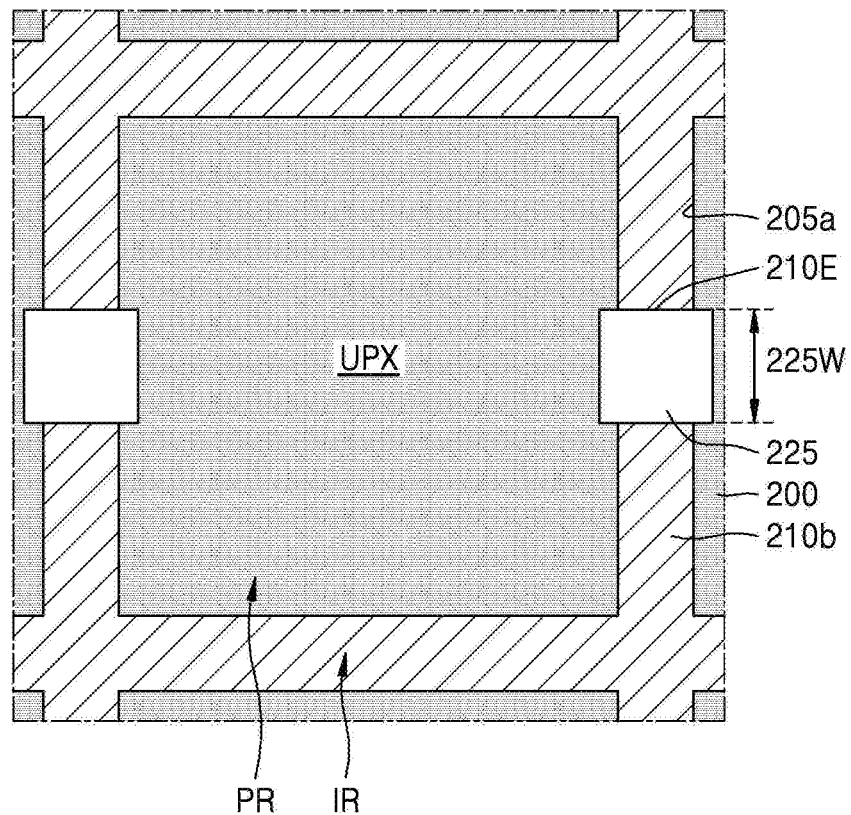
Figure 10D:
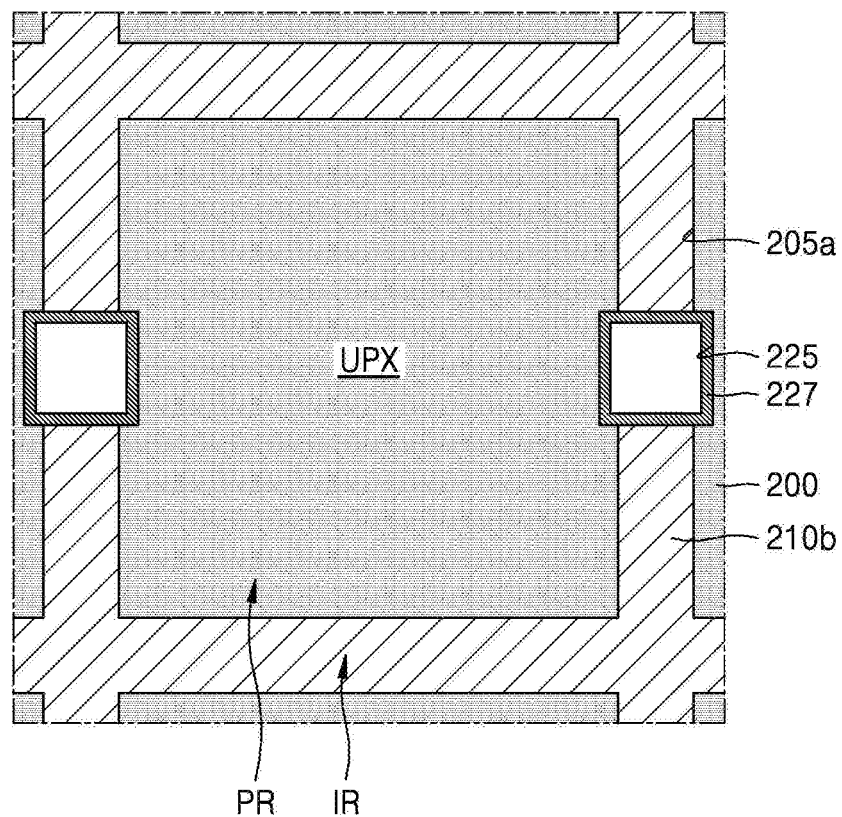
Figure 11:
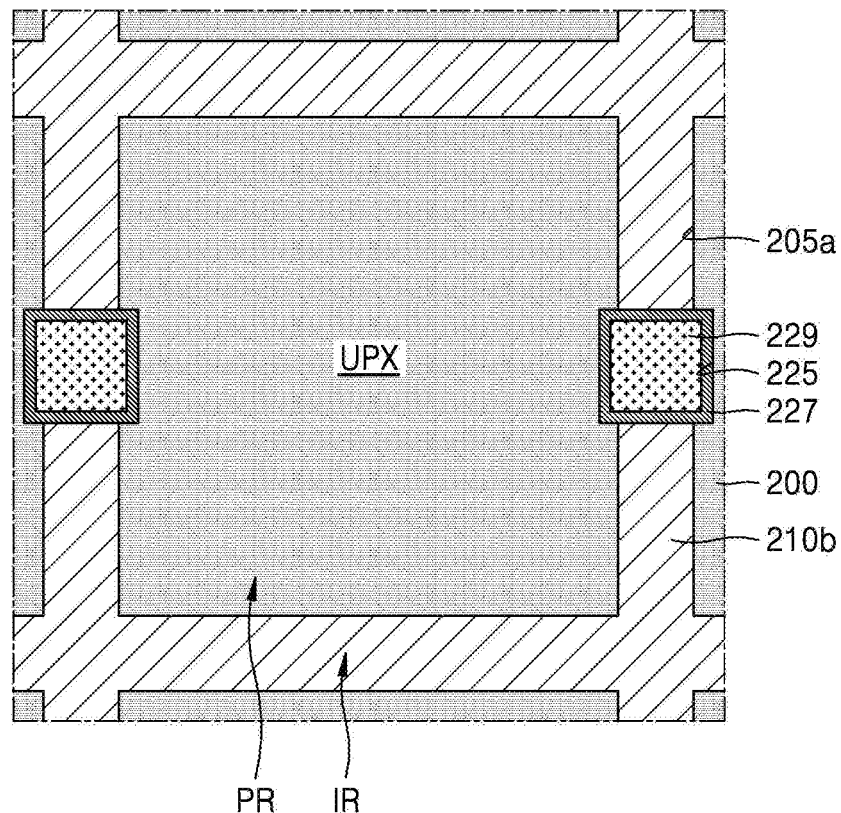
FIG. 11 illustrates a horizontal cross-sectional view of a portion of an image sensor according to an embodiment.

FIGS. 10A to 10D illustrate horizontal cross-sectional views showing a method of manufacturing an image sensor according to an example embodiment, and FIG. 11 illustrates a horizontal cross-sectional view of a portion of an image sensor according to an example embodiment. Configuration components of FIGS. 1A and 1B may also be referred to herebelow.

Referring to FIG. 10A, some portions of the semiconductor substrate 200 are removed to form a trench 205a. The trench 205a may be formed to surround some portions of the unit pixel UPX. In some portions of the isolation region IR, between two facing ends 205E of the trench 205a, some portions 200G of the semiconductor substrate 200 may be disposed. In the isolation region IR, a distance between the two facing ends 205E of the trench 205a (e.g., a width of the some portions 200G of the semiconductor substrate 200) may be a first width 200GW.

Referring to FIG. 10B, a second device isolation layer 210b filling the trench 205a is formed. The second device isolation layer 210b may be formed using a similar method to the forming of the second device isolation layer 210 described in FIG. 2B.

Referring to FIGS. 10B and 10C, the via hole 225 is formed using a similar method as described with reference to FIG. 2C. When the via hole 225 is formed, some portions 200G of the semiconductor substrate 200 disposed between the two facing ends 205E of the trench 205a in the isolation region IR may be removed. Thus, the second device isolation layer 210b may be exposed through some portions of an inner side surface of the via hole 225.

In a direction in which two ends 210E of the second device isolation layer 210b face each other in the isolation regions IR, a width of the via hole 225 may be the second width 225W. In some embodiments, the second width 225W may be equal to or greater than the first width 200GW.

Referring to FIG. 10D, the side surface insulating layer 227 covering an inner side surface of the via hole 225 is formed.

Also referring to FIG. 11, the first via plug 229 filling an inside of the via hole 225 of which an inner side surface is covered by the side surface insulating layer 227 is formed to constitute an image sensor 100g.

The image sensor 100g of FIG. 11 may include the side surface insulating layer 227 covering a side surface of the via hole 225 between the first via plug 229 and the second device isolation layer 210b in a similar manner as the image sensor 100 of FIGS. 3A and 3B.

Figure 12A:
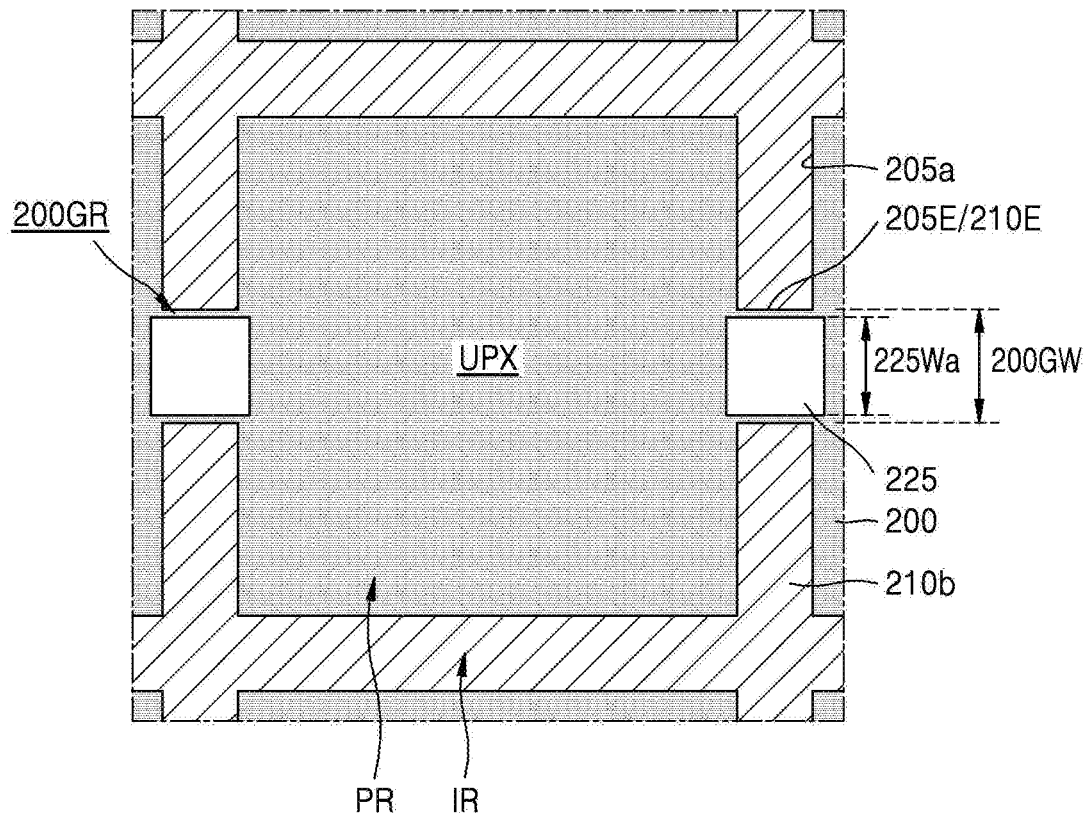
FIGS. 12A and 12B illustrate horizontal cross-sectional views showing a method of manufacturing an image sensor, according to an embodiment.
Figure 12B:
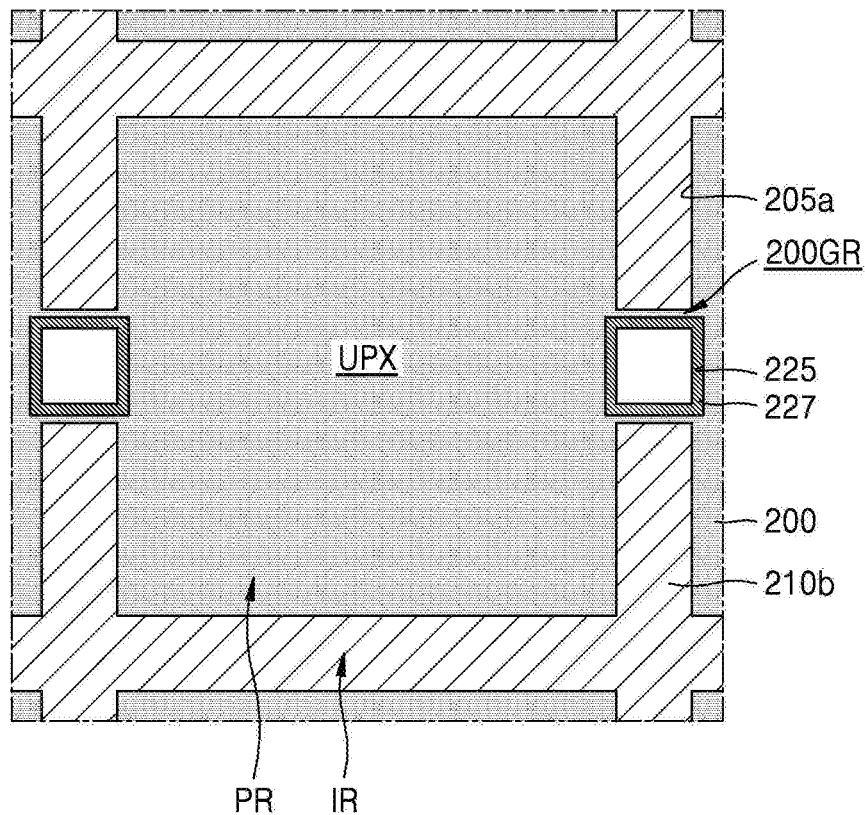
Figure 13A:
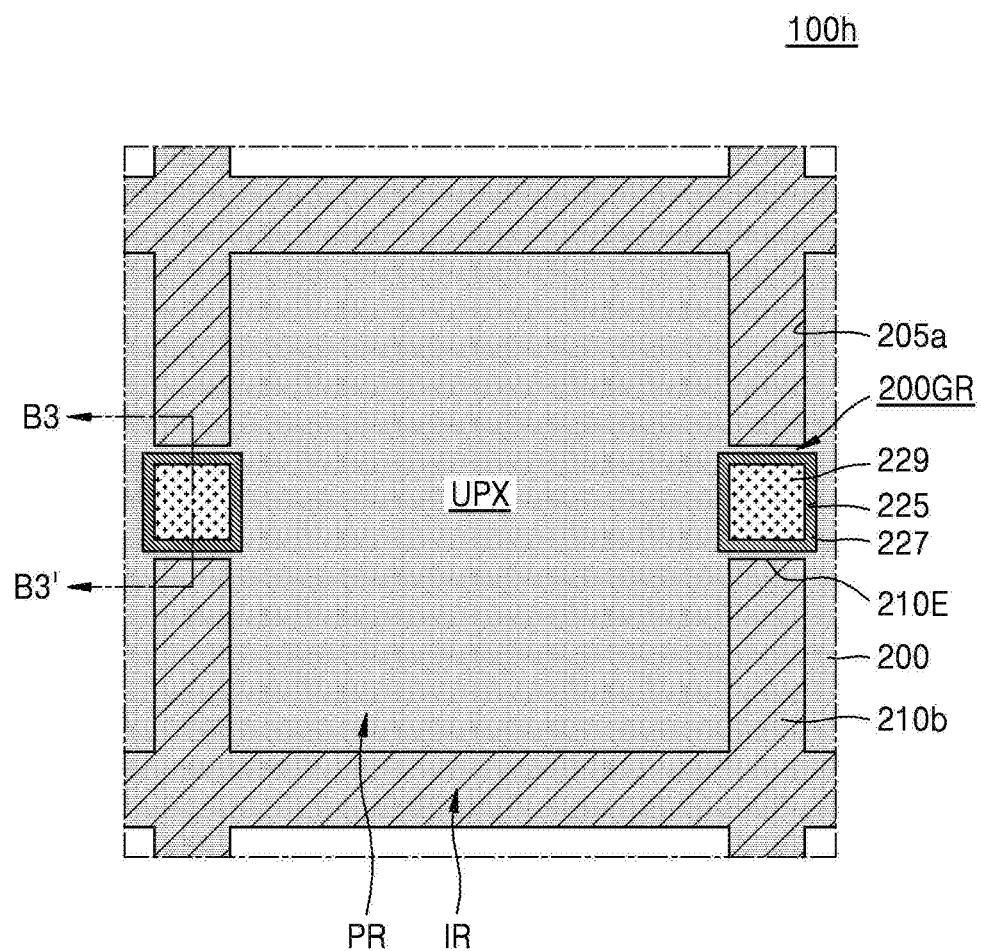
FIGS. 13A and 13B respectively illustrate a horizontal cross-sectional view of a portion of an image sensor according to an embodiment and a vertical cross-sectional view of some enlarged portions thereof.
Figure 13B:
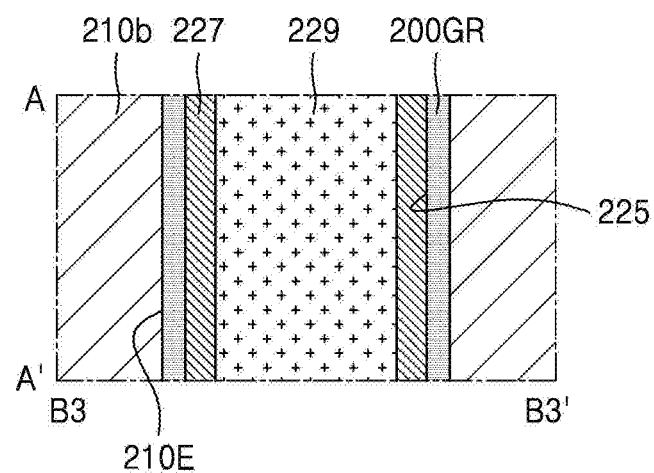

FIGS. 12A and 12B illustrate horizontal cross-sectional views showing a method of manufacturing an image sensor according to an example embodiment, and FIGS. 13A and 13B respectively illustrate a horizontal cross-sectional view of a portion of an image sensor according to an example embodiment and an enlarged vertical cross-sectional view showing some portions thereof. In detail, FIG. 12A is a horizontal cross-sectional view showing a process after the process shown in FIG. 10B, and configuration components of FIGS. 1A and 1B may also be referred to herebelow. Also, FIG. 13B is a vertical cross-sectional view showing an enlarged portion taken along a line A-A' of FIGS. 1A and 1B and a line B3-B3' of FIG. 13A.

Also, although not illustrated separately, a width of the via hole 225 may be formed to be similar to a width of the second device isolation layer 210*b* as shown in FIG. 4A, or the first via plug 229 may be formed to be located at a corner of the unit pixel UPX as shown in FIGS. 4B and 4C.

Referring to FIG. 12A, the via hole 225 is formed in a similar method as described with reference to FIG. 10C. When the via hole 225 is formed, some portions 200G of the semiconductor substrate 200 disposed between two facing ends 205E of the trench 205*a* in the isolation region IR may not be entirely removed and may remain as a remained semiconductor layer 200GR. As the remained semiconductor layer 200GR is a portion of the semiconductor substrate 200, the remained semiconductor layer 200GR may be formed of the same material as the semiconductor substrate 200. In some embodiments, the second device isolation layer 210*b* may not be exposed through an inner side surface of the via hole 225.

In a direction in which two ends 210E of the second device isolation layer 210*b* face each other in the isolation region IR, a width of the via hole 225, which is a second width 225Wa, may be smaller than a width between the two ends 210E of the second device isolation layer 210*b*, which is the first width 200GW.

In some embodiments, one of the two ends 210E of the second device isolation layer 210*b* facing each other with respect to the via hole 225 may be exposed through an inner side surface of the via hole 225, and the other may not be exposed through an inner side surface of the via hole 225. In this case, the remained semiconductor layer 200GR may be disposed only between one of the two ends 210E of the second device isolation layer 210*b* facing each other with respect to the via hole 225 and the via hole 225.

Referring to FIG. 12B, the side surface insulating layer 227 covering an inner side surface of the via hole 225 is formed.

Referring to FIGS. 13A and 13B, the first via plug 229 filling an inside of the via hole 225 of which an inner side surface is covered by the side surface insulating layer 227 is formed to constitute an image sensor 100*h*.

Between the first via plug 229 and the second device isolation layer 210*b*, the side surface insulating layer 227 covering a side surface of the via hole 225 and the remained semiconductor layer 200GR may be disposed.

In some embodiments, the remained semiconductor layer 200GR may be disposed only between the via hole 225 and one of the two ends 210E of the second device isolation layer 210*b* facing each other with respect to the first via plug 229. In other words, the side surface insulating layer 227 and the remaining semiconductor layer 200GR may be between the first via plug 229 and one of the two ends 210E of the second device isolation layer 210*b* facing each other with respect to the first via plug 229, and the side surface insulating layer 227 may be only between the first via plug 229 and the other end of the two ends 210E of the second device isolation layer 210*b*.

In addition, although not illustrated separately, a width of the via hole 225 may be formed to be similar to a width of the second device isolation layer 210*b* as shown in FIG. 4A, or the first via plug 229 may be formed to be located at a corner of the unit pixel UPX as shown in FIGS. 4B and 4C.

Figure 14A:
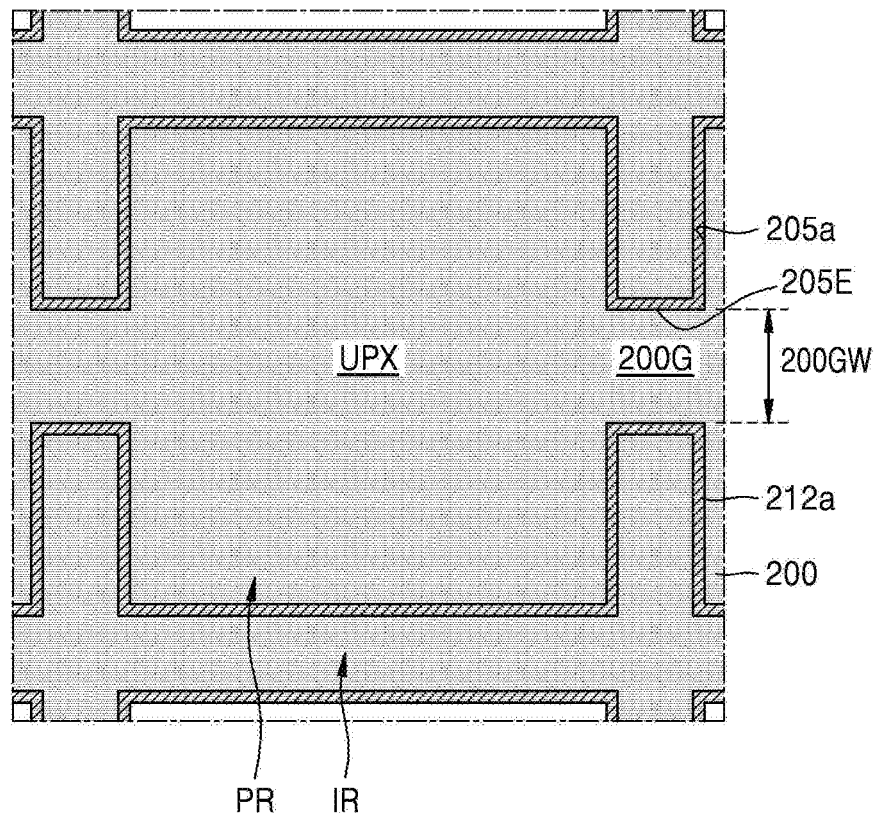
FIGS. 14A to 14C illustrate horizontal cross-sectional views showing a method of manufacturing an image sensor, according to an embodiment.
Figure 14B:
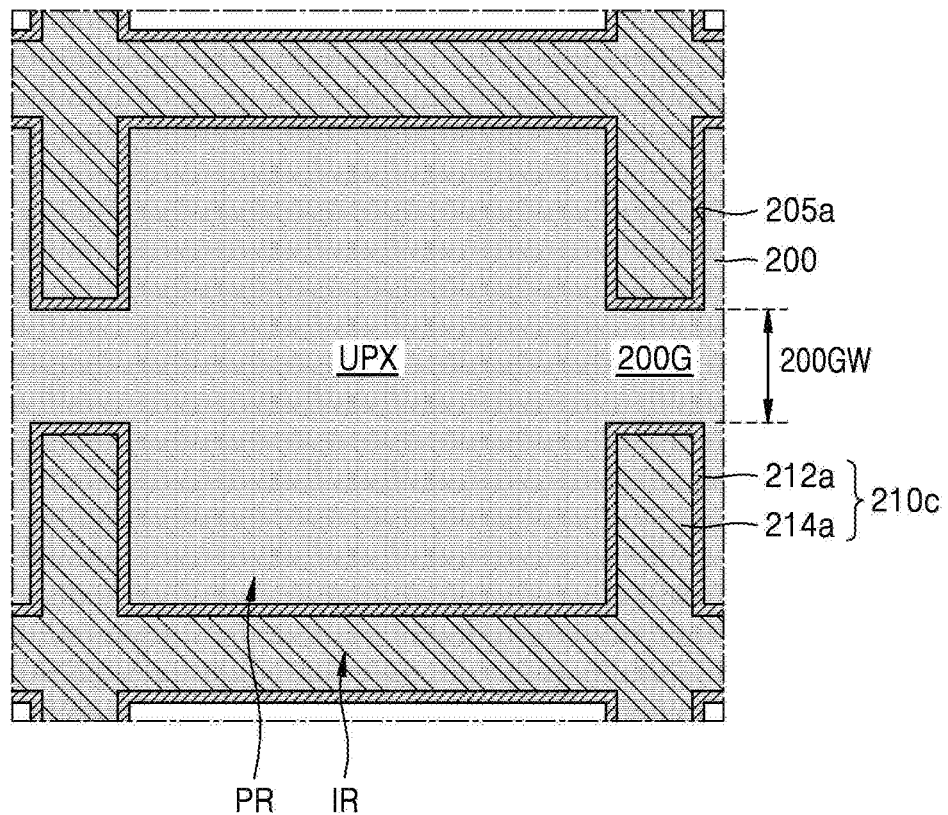
Figure 14C:
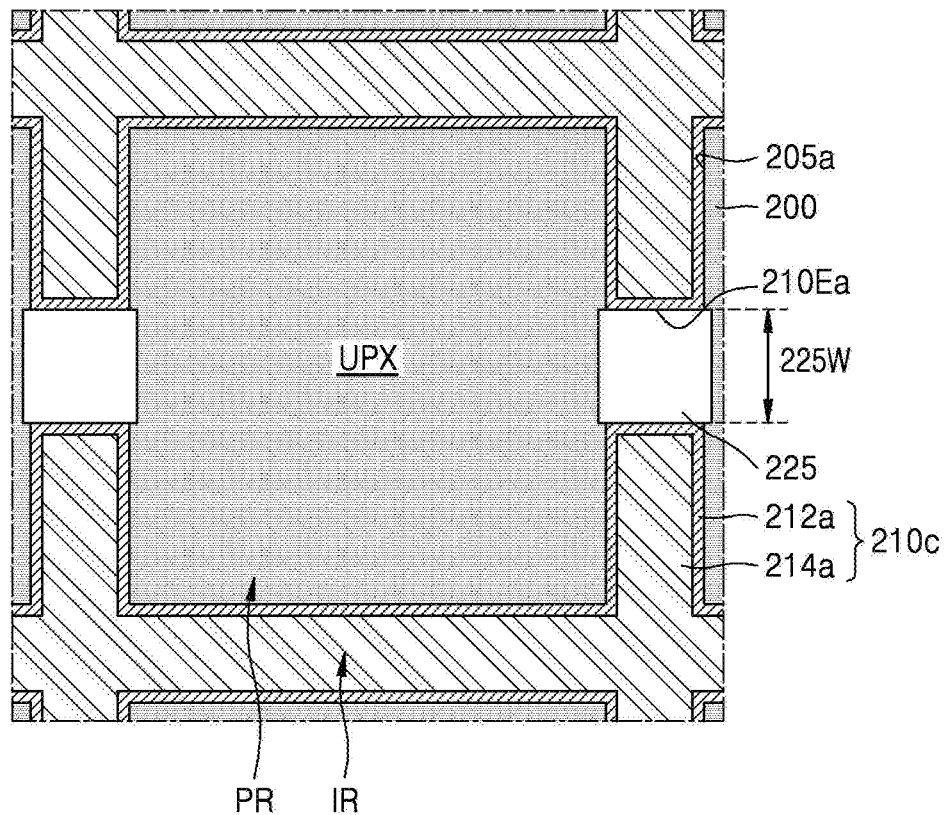
Figure 15A:
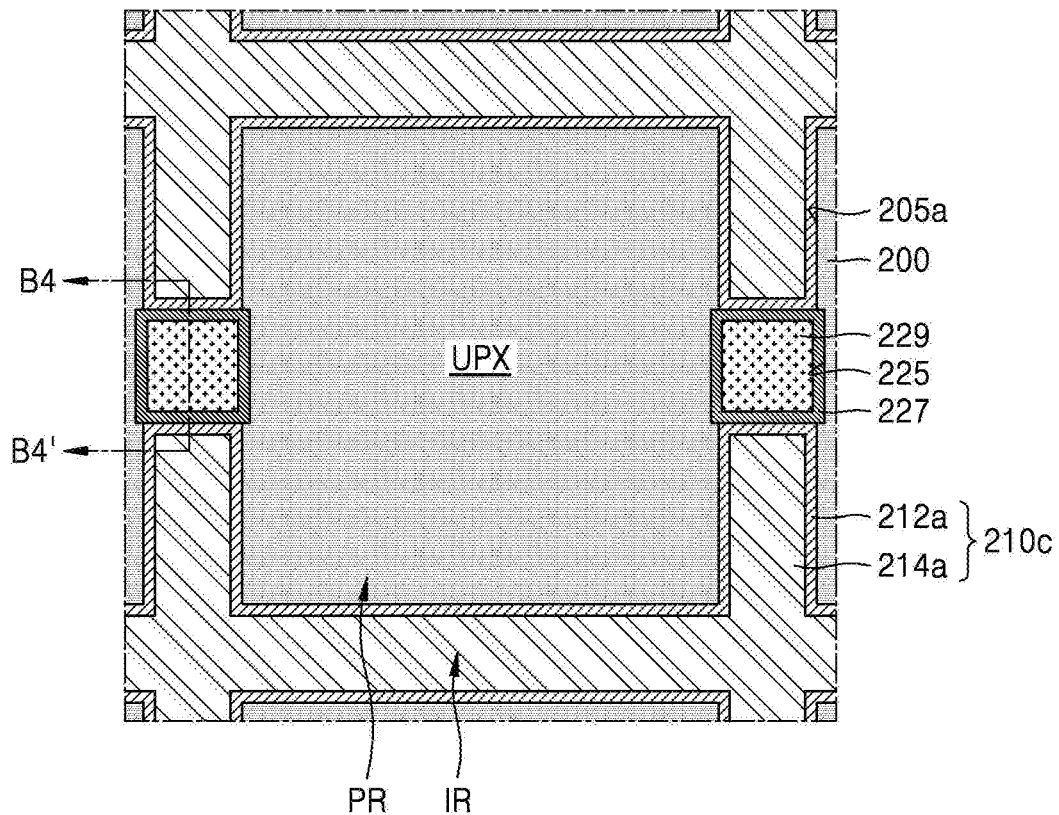
FIGS. 15A and 15B respectively illustrate a horizontal cross-sectional view of a portion of an image sensor according to an embodiment and a vertical cross-sectional view of some enlarged portions thereof.
Figure 15B:
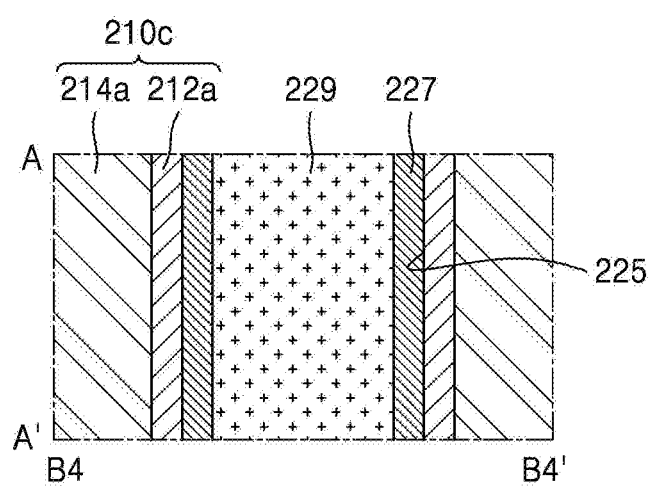

FIGS. 14A to 14C illustrate horizontal cross-sectional views showing a method of manufacturing an image sensor according to an example embodiment, and FIGS. 15A and 15B respectively illustrate a horizontal cross-sectional view of a portion of an image sensor according to an example embodiment and an enlarged vertical cross-sectional view showing some portions thereof. In detail, FIG. 14A is a horizontal cross-sectional view showing a process after the process shown in FIG. 10A, and configuration components of FIGS. 1A and 1B may also be referred to herebelow. Also, FIG. 15B is a vertical cross-sectional view showing an enlarged portion taken along a line A-A' of FIGS. 1A and 1B and a line B4-B4' of FIG. 15A.

Referring to FIG. 14A, a cover isolation layer 212*a* covering an inner side surface of the trench 205*a* is formed. In some embodiments, the cover isolation layer 212*a* may cover both an inner side surface and a bottom surface of the trench 205*a*.

Referring to FIG. 14B, a core isolation layer 214*a* filling an inside of the trench 205*a* of which an inner side surface is covered by the cover isolation layer 212*a* is formed, and then a second device isolation layer 210*c* including the cover isolation layer 212*a* and the core isolation layer 214*a* is formed.

Referring to FIGS. 14B and 14C, the via hole 225 is formed in a similar method as described with reference to FIG. 10C. When the via hole 225 is formed, some portions 200G of the semiconductor substrate 200 disposed between two facing ends 205Ea of the trench 205*a* in the isolations region IR may be removed. Thus, the cover isolation layer 212*a* of the second device isolation layer 210*c* may be exposed through some portions of an inner side surface of the via hole 225.

In a direction in which two ends 210Ea of the second device isolation layer 210*c* face each other in the isolation region IR, a width of the via hole 225 may be the second width 225W. In some embodiments, the second width 225W may be equal to or greater than the first width 200GW.

Referring to FIGS. 15A and 15B, the side surface insulating layer 227 covering an inner side surface of the via hole 225 and the first via plug 229 filling an inside of the via hole 225 of which an inner side surface is covered by the side surface insulating layer 227 are formed to form an image sensor 100*i*.

The side surface insulating layer 227 may be disposed between the first via plug 229 and the second device isolation layer 210*c*. As the second device isolation layer 210*c* includes the cover isolation layer 212*a* and the core isolation layer 214*a*, the cover isolation layer 212*a* and the side surface insulating layer 227 may be disposed between the core isolation layer 214*a* and the first via plug 229.

In addition, although not illustrated separately, a width of the via hole 225 may be formed to be similar to a width of the second device isolation layer 210*c* as illustrated in FIG. 4A, or the first via plug 229 may be formed to be located at a corner of the unit pixel UPX as illustrated in FIGS. 4B and 4C.

Figure 16:
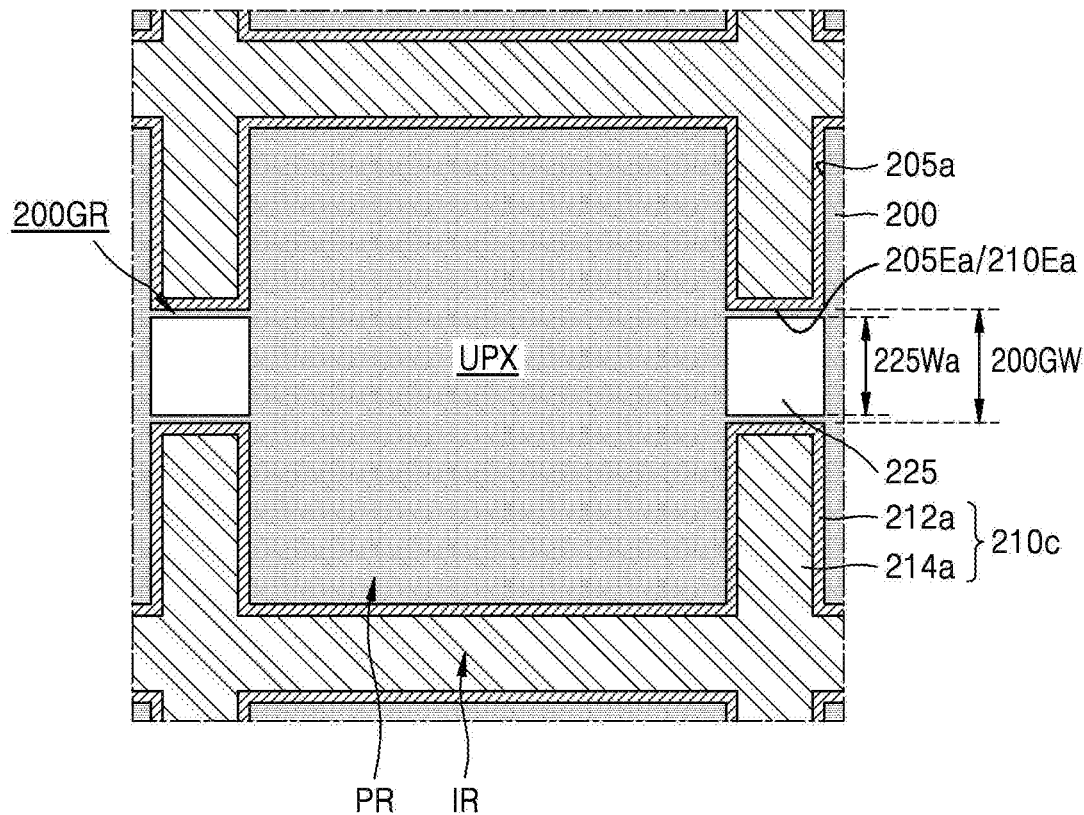
FIG. 16 illustrates a horizontal cross-sectional view showing a method of manufacturing an image sensor, according to an embodiment.
Figure 17A:
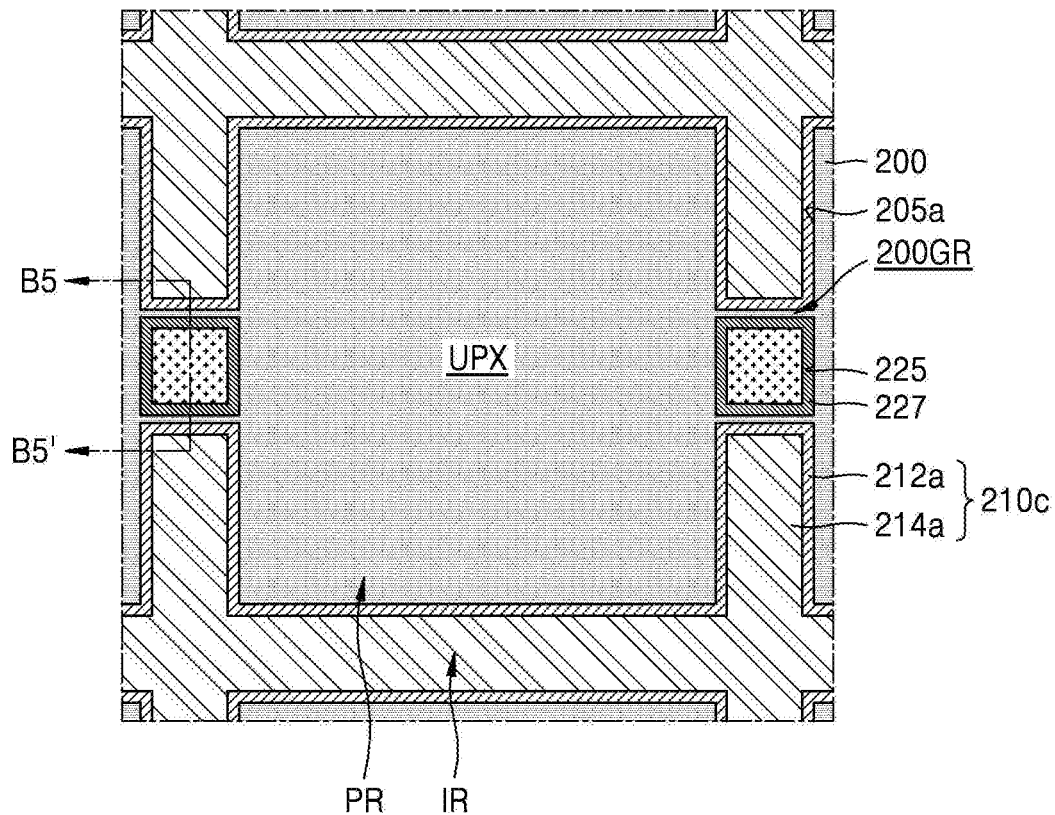
FIGS. 17A and 17B respectively illustrate a horizontal cross-sectional view of a portion of an image sensor according to an embodiment and a vertical cross-sectional view of some enlarged portions thereof.
Figure 17B:
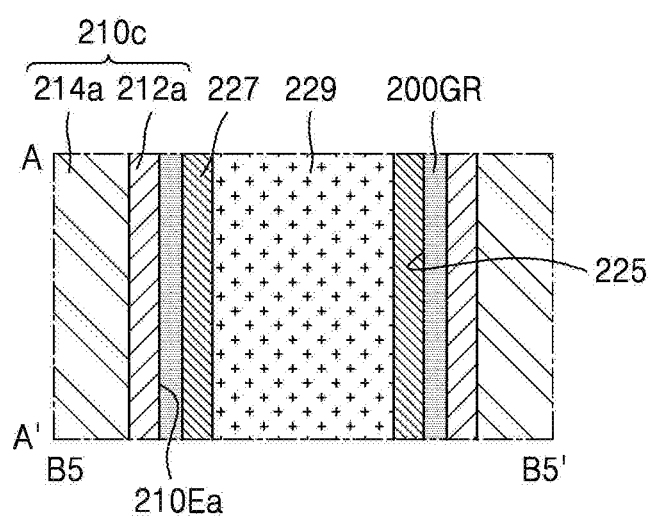

FIG. 16 illustrates a horizontal cross-sectional view showing a method of manufacturing an image sensor according to an example embodiment, and FIGS. 17A and 17B respectively illustrate a horizontal cross-sectional view of a portion of an image sensor according to an example embodiment and an enlarged vertical cross-sectional view showing some portions thereof. In detail, FIG. 16 is a horizontal cross-sectional view showing a process after the process shown in FIG. 14B, and configuration components of FIGS. 1A and 1B may also be referred to herebelow. Also, FIG. 17B is a vertical cross-sectional view showing an enlarged portion taken along a line A-A' of FIGS. 1A and 1B and a line B5-B5' of FIG. 17A.

Referring to FIG. 16, the via hole 225 is formed in a similar method as described with reference to FIG. 12A. When the via hole 225 is formed, some portions (200G of FIG. 14B) of the semiconductor substrate 200 disposed between two facing ends 205Ea of the trench 205a in the isolation region IR may not be fully removed and thus may remain as the remained semiconductor layer 200GR. In some embodiments, the second device isolation layer 210c that is the cover isolation layer 212a may not be exposed through an inner side surface of the via hole 225.

In a direction in which two ends 210Ea of the second device isolation layer 210c face each other in the isolation region IR, a width of the via hole 225, which is a second width 225Wa, may be smaller than a width between two ends 210Ea of the second device isolation layer 210c, which is the first width 200GW.

Referring to FIGS. 17A and 17B, the side surface insulating layer 227 covering an inner side surface of the via hole 225 and the first via plug 229 filling an inside of the via hole 225 of which an inner side surface is covered by the side surface insulating layer 227 are formed to constitute an image sensor 100j.

The side surface insulating layer 227 and the remained semiconductor layer 200GR may be disposed between the first via plug 229 and the second device isolation layer 210c. As the second device isolation layer 210c includes the cover isolation layer 212a and the core isolation layer 214a, the cover isolation layer 212a, the remained semiconductor layer 200GR, and the side surface insulating layer 227 may be disposed between the core isolation layer 214a and the first via plug 229.

In some embodiments, the remained semiconductor layer 200GR may only be disposed between the via hole 225 and one of two ends 210Ea of the second device isolation layer 210c facing each other with respect to the first via plug 229. In other words, the side surface insulating layer 227 and the remained semiconductor layer 200GR may be between the first via plug 229 and one of the two ends 210Ea of the second device isolation layer 210c facing each other with respect to the first via plug 229, and the side surface insulating layer 227 may be only between the first via plug 229 and the other end of the two ends 210Ea of the second device isolation layer 210c.

Also, although not illustrated separately, a width of the via hole 225 may be formed to be similar to a width of the second device isolation layer 210c as shown in FIG. 4A, and the first via plug 229 may be formed to be located at a corner of the unit pixel UPX as shown in FIGS. 4B and 4C.

Figure 18:
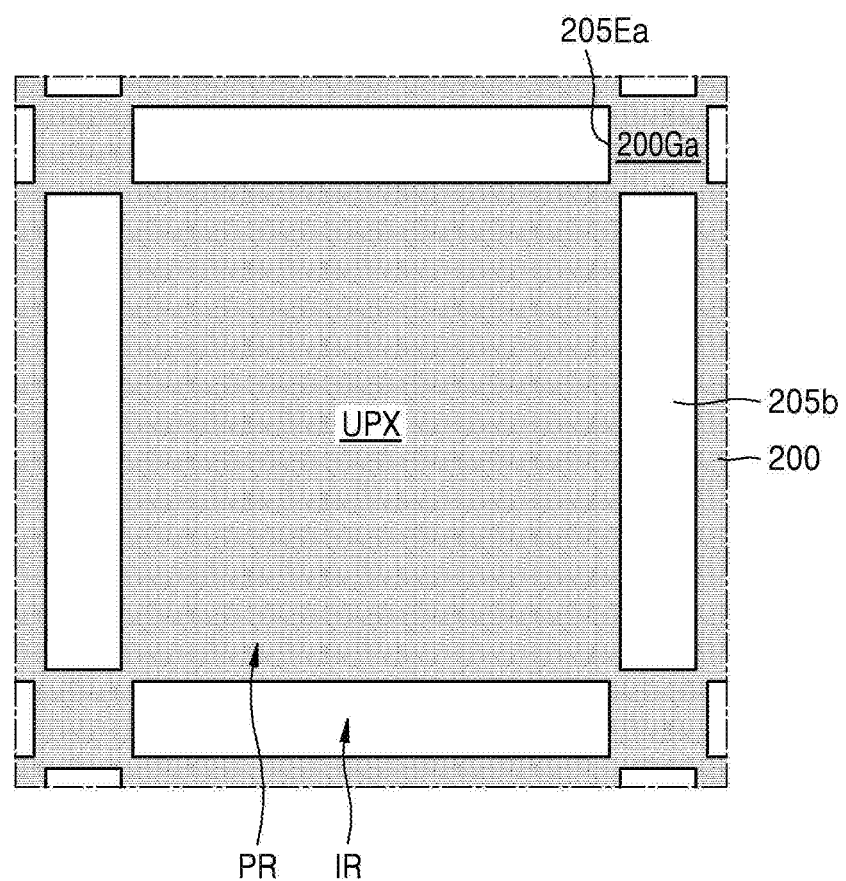
FIG. 18 illustrates a horizontal cross-sectional view showing a method of manufacturing an image sensor, according to an embodiment.

FIG. 18 illustrates a horizontal cross-sectional view showing a method of manufacturing an image sensor according to an example embodiment.

Referring to FIG. 18, some portions of the semiconductor substrate 200 are removed to form a trench 205b. The trench 205b may be formed to surround some portions of the unit pixel UPX. Some portions 200Ga of the semiconductor substrate 200 may be disposed between two facing ends 205Eb of the trench 205b in some portions of the isolation region IR.

Four trenches 205b spaced apart from each other may be disposed around a unit pixel UPX. The four trenches 205b may be respectively arranged along four sides of the unit pixel UPX. Also, some portions 200Ga of the semiconductor substrate 200 may be arranged close to an area between ends 205Eb of trenches 205b that is a corner of the unit pixel UPX. In some portions 200Ga of the semiconductor substrate 200 disposed close to four corners of the unit pixel UPX, the via hole 225b, a side surface insulating layer 227b, and a first via plug 229b may be formed as shown in FIG. 4B, or a via hole 225c, a side surface insulating layer 227c, and a first via plug 229c may be formed as shown in FIG. 4C.

The second device isolation layer 210 of FIG. 4B or 4C may be formed in each of four trenches 205b, or a second device isolation layer similar to the second device isolation layers 210a and 210c of FIG. 9A or FIG. 15A may be formed therein.

Figure 19:
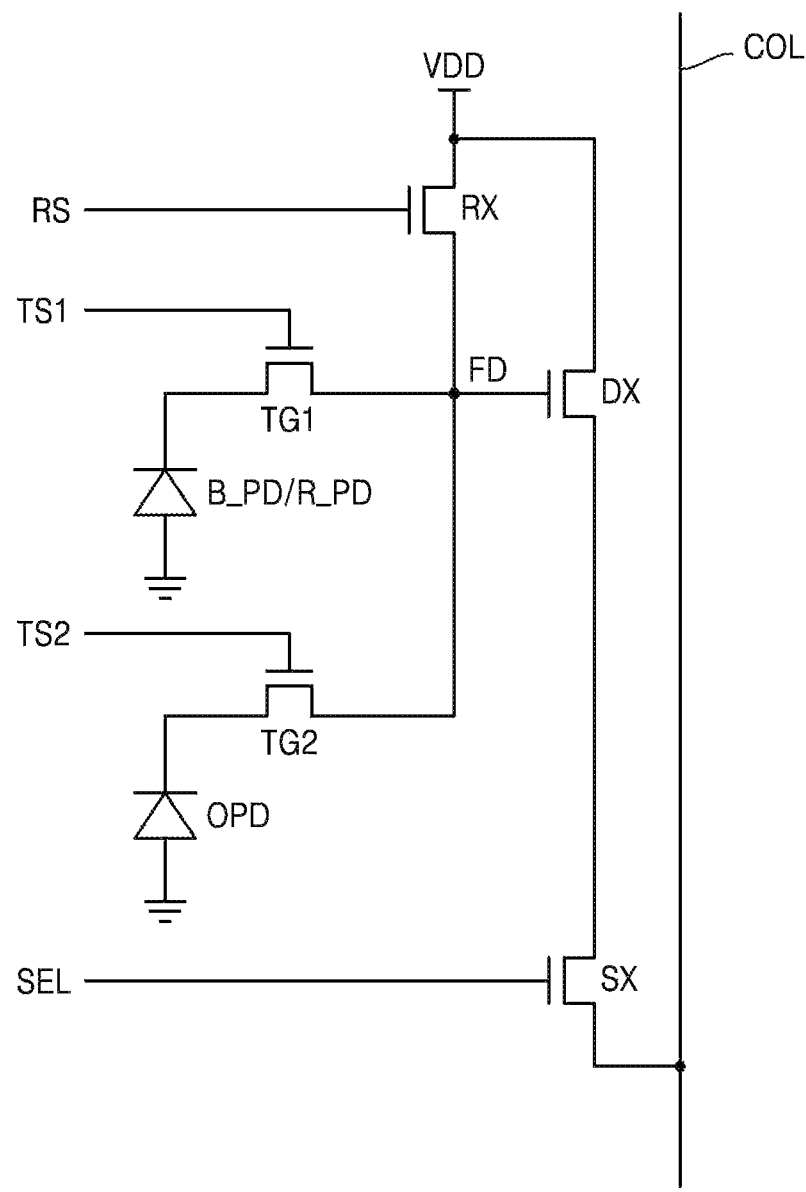
FIG. 19 illustrates a readout circuit diagram of an image sensor according to an embodiment.

FIG. 19 illustrates a readout circuit diagram of an image sensor according to an example embodiment.

Referring to FIG. 19, OPD and B_PD share a floating diffusion region FD. Also, in another example, OPD and R_PD share the floating diffusion region FD. The floating diffusion region FD may be referred to as a floating diffusion node. In terms of pixels, a green pixel and a red pixel share the floating diffusion region FD. Also, the green pixel and a blue pixel share the floating diffusion region FD.

A readout circuit includes first and second transmission transistors TG1 and TG2, the floating diffusion region FD, a reset transistor RX, a drive transistor DX, and a selection transistor SX.

The first transmission transistor TG1 operates in response to a first transmission control signal TS1, the second transmission transistor TG2 operates in response to a second transmission control signal TS2, the reset transistor RX operates in response to a reset control signal RS, and the selection transistor SX operates in response to a selection signal SEL.

If an activation time of the first transmission control signal TS1 and an activation time of the second transmission control signal TS2 are appropriately controlled, a signal corresponding to electric charge generated by B_PD or R_PD and a signal corresponding to electric charge generated by OPD may be transmitted to a column line COL, respectively, according to operations of the drive and selection transistors DX and SX.

Here, OPD, B_PD, or R_PD may be embodied as a photo transistor, a photo gate, a pinned photo diode (PPD), or a combination thereof.

For example, OPD may be configured by the organic photoelectric layer 274 of FIGS. 1A and 1B. For example, B_PD or R_PD may be configured by the photoelectric conversion device 204 in FIGS. 1A and 1B. For example, B_PD may be configured by the photoelectric conversion device 204 corresponding to the first color filter layer 24, as in FIGS. 1A and 1B. For example, R_PD may be configured by the photoelectric conversion device 204 corresponding to the second color filter layer 244, as in FIGS. 1A and 1B.

In some embodiments, each of the floating diffusion region FD, the reset transistor RX, the drive transistor DX, and the selection transistor SX may be separately included in a first readout circuit that reads out electric charge generated by O_PD or R_PD and includes the first transmission transistor TG1, and included in a second readout circuit that reads out electric charge generated by the first readout circuit and OPD and includes the second transmission transistor TG2.

An image sensor according to the disclosed embodiments does not need to secure a space for forming a penetrating electrode structure in a unit pixel since the penetrating electrode structure including a via plug is disposed in an isolation region where a device isolation layer is disposed.

Thus, a horizontal area of the unit pixel is secured and photoelectric conversion efficiency of the image sensor may be improved.

As the penetrating electrode structure may also play a role of the device isolation layer, an electrical and optical crosstalk between adjacent unit pixels may not occur.

As a result, an image sensor according to the disclosed embodiments may improve color reproduction and reduce a pixel size.

While the concepts have been particularly shown and described with reference to embodiments thereof, it will be understood that various changes in form and details may be made therein without departing from the spirit and scope of the following claims.

What is claimed is:

1. An image sensor, comprising:
    a semiconductor substrate comprising a plurality of pixel regions spaced apart from each other and an isolation region surrounding each of the plurality of pixel regions, the plurality of pixel regions having a plurality of unit pixels;
    a plurality of device isolation structures, each of the plurality of device isolation structures being disposed in the isolation region and extending from a bottom surface of the semiconductor substrate to a top surface of the semiconductor substrate, the bottom surface being opposite the top surface;
    a first transparent electrode layer disposed over the semiconductor substrate;
    an organic photoelectric layer disposed on the first transparent electrode layer;
    a second transparent electrode layer disposed on the organic photoelectric layer;
    a via plug electrically connected to the first transparent electrode layer, and arranged between adjacent device isolation structures among the plurality of device isolation structures, the via plug passing through the isolation region; and
    a side surface insulating layer contacting a side surface of the via plug and arranged between the adjacent device isolation structures and the via plug,
    wherein each of the plurality of device isolation structures comprises a core isolation layer formed of a metal or a semiconductor material, and a cover isolation layer covering a side wall of the core isolation layer and formed of an insulation material,
    wherein the cover isolation layer is disposed between the side surface insulating layer and the core isolation layer, and
    wherein each of the plurality of device isolation structures surrounds at least three sides of a unit pixel of the plurality of unit pixels.

2. The image sensor of claim 1, wherein, between two adjacent unit pixels among the plurality of unit pixels, a width of a penetrating via structure including the via plug and the side surface insulating layer is equal to or greater than a width of each of the plurality of device isolation structures.

3. The image sensor of claim 1, further comprising a semiconductor layer arranged between the side surface insulating layer and the core isolation layer, and formed of the same material as the semiconductor substrate.

4. The image sensor of claim 1, further comprising a semiconductor layer arranged between the side surface insulating layer and one of the plurality of device isolation structures, and formed of the same material as the semiconductor substrate.

5. The image sensor of claim 1,
    wherein the via plug is located between two adjacent unit pixels among the plurality of unit pixels, and
    wherein a width of the via plug is less than a width of one of the plurality of device isolation structures.

6. The image sensor of claim 1,
    wherein the first transparent electrode layer is configured as a plurality of parts spaced apart from each other and arranged in the plurality of pixel regions, and
    wherein the second transparent electrode layer is configured as an integral part over the plurality of pixel regions.

7. An image sensor, comprising:
    a semiconductor substrate comprising a plurality of pixel regions spaced apart from each other and an isolation region surrounding each of the plurality of pixel regions, the plurality of pixel regions having a plurality of unit pixels;
    a plurality of device isolation structures, each of the plurality of device isolation structures being disposed in the isolation region and extending from a bottom surface of the semiconductor substrate to a top surface of the semiconductor substrate, the bottom surface being opposite the top surface;
    a first transparent electrode layer disposed over the semiconductor substrate;
    an organic photoelectric layer disposed on the first transparent electrode layer;
    a second transparent electrode layer disposed on the organic photoelectric layer;
    a via plug electrically connected to the first transparent electrode layer, and arranged between adjacent device isolation structures among the plurality of device isolation structures, the via plug passing through the isolation region;
    a side surface insulating layer contacting a side surface of the via plug and arranged between the adjacent device isolation structures and the via plug; and
    a semiconductor layer arranged between the side surface insulating layer and one of the adjacent device isolation structures, and formed of the same material as the semiconductor substrate,
    wherein each of the plurality of device isolation structures surrounds at least three sides of a unit pixel of the plurality of unit pixels.

8. The image sensor of claim 7, wherein the side surface insulating layer extends from the bottom surface of the semiconductor substrate to the top surface of the semiconductor substrate.

* * * * *